US006970371B1

(12) United States Patent
Summerfelt et al.

(10) Patent No.: US 6,970,371 B1

(45) Date of Patent: Nov. 29, 2005

(54) REFERENCE GENERATOR SYSTEM AND METHODS FOR READING FERROELECTRIC MEMORY CELLS USING REDUCED BITLINE VOLTAGES

(75) Inventors: Scott Robert Summerfelt, Garland, TX (US); Hugh P. McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/847,412

(22) Filed: May 17, 2004

(51) Int. Cl.[7] .............................................. G11C 11/22

(52) U.S. Cl. ...................................... 365/145; 365/191

(58) Field of Search ................................ 365/145, 191

(56) References Cited

U.S. PATENT DOCUMENTS

| | | | | |
|---|---|---|---|---|
| 5,309,391 | A * | 5/1994 | Papaliolios | 365/145 |
| 5,680,344 | A * | 10/1997 | Seyyedy | 365/145 |
| 5,835,400 | A * | 11/1998 | Jeon et al. | 365/145 |
| 6,046,928 | A | 4/2000 | Takata | |
| 6,208,550 | B1 | 3/2001 | Kim | |
| 6,487,103 | B2 | 11/2002 | Yamamoto et al. | |
| 6,487,104 | B2 * | 11/2002 | Takashima | 365/145 |
| 6,493,251 | B2 | 12/2002 | Hoya et al. | |
| 6,510,073 | B1 | 1/2003 | Lee et al. | |
| 6,635,498 | B2 * | 10/2003 | Summerfelt et al. | 438/3 |
| 6,661,697 | B2 | 12/2003 | Yamamoto et al. | |
| 6,667,896 | B2 | 12/2003 | Rickes et al. | |
| 6,873,536 | B2 * | 3/2005 | Komatsuzaki | 365/145 |
| 2003/0031042 | A1 | 2/2003 | Yamamoto et al. | |
| 2003/0103372 | A1 | 6/2003 | Matsushita | |
| 2003/0174532 | A1 | 9/2003 | Matsushita et al. | |
| 2003/0206430 | A1 | 11/2003 | Ho | |

OTHER PUBLICATIONS

U.S. Appl. No. 10/717,146, filed Nov. 18, 2003, Madan.

U.S. Appl. No. 10/748,041, filed Dec. 29, 2003, Madan.

U.S. Appl. No. 10/805,809, filed Mar. 22, 2004, Madan et al.

"A Bit-Line GND Sense Technique for Low-Voltage Operation FeRAM", Shoichiro Kawashima, Toru Endo, Akira Yamamoto, Ken'ichi Nakabayashi, Mitsuharu Nakazawa, Keizo Morita and Masaki Aoki, 2001 Symposium on VLSI Circuits Digest of Technical Papers, pp. 127 & 128.

"A Survey of Circuit Innovations in Ferroelectric Random-Access Memories", Ali Sheikholeslami and P. Glenn Gulak, Proceedings of the IEEE, vol. 88, No. 5, May 2000, pp. 667-689.

U.S. Appl. No. 10/866,834, filed Jun. 14, 2004, Madan et al.

* cited by examiner

*Primary Examiner*—M. Tran

(74) *Attorney, Agent, or Firm*—Jacqueline J. Garner; W. James Brady, III; Frederick J. Telecky, Jr.

(57) ABSTRACT

Methods (200) and systems (108) are provided for reading data from ferroelectric memory cells (106) in which charge is removed from a sense amp input (SABL/SABLB) prior to application of a plateline signal (PL) to the target cell capacitor ($C_{FE}$). Where the sense amp input (SABL/SABLB) is initially precharged to zero volts, the extraction of charge provides a negative voltage on the data bitline (BL/BLB) when the plateline signal (PL) is applied, allowing adequate voltage to be applied across the cell capacitor ($C_{FE}$) together with reduced plateline voltages (PL).

34 Claims, 14 Drawing Sheets

REFERENCE GENERATOR SYSTEM AND METHODS FOR READING FERROELECTRIC MEMORY CELLS USING REDUCED BITLINE VOLTAGES

FIELD OF INVENTION

The present invention relates generally to semiconductor devices and more particularly to improved methods and apparatus for reading ferroelectric memory cells using reduced bitline voltages.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, communications devices, and the like. Ferroelectric memories store data in ferroelectric capacitors, and are commonly organized in single-transistor, single-capacitor (1T1C) or two-transistor, two-capacitor (2T2C) configurations. In a folded bitline 1T1C architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for read operations. The individual cells are commonly organized as individual bits of a corresponding data word, where the cells of a given word are accessed concurrently by activation of platelines and wordlines by address decoding control circuitry.

Ferroelectric memory devices provide non-volatile data storage where the cell capacitors are constructed using ferroelectric dielectric material that may be polarized in one direction or another in order to store a binary data value. The ferroelectric effect in the cell capacitors provides retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

Data in a typical ferroelectric memory device is read by connecting a reference voltage to a first bitline, and connecting the target cell capacitor between a complementary bitline and a plateline pulse signal. This provides a differential voltage on the bitline pair, which is connected to a differential sense amp circuit. The reference voltage is typically supplied at an intermediate voltage between the voltage associated with a capacitor storing a binary "0" and that of the capacitor storing a binary "1". The polarity of the sensed differential voltage thus represents the data stored in the cell, which is buffered by the sense amp and provided to a pair of local IO lines. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between an activated plateline and the bitline during a read operation causes an electric field to be applied to the cell capacitor. If the field is applied in a direction to switch or reverse the internal dipoles, more charge will be moved than if the dipoles are not reversed. As a result of this ferroelectric behavior, the sense amplifier can measure the charge applied to the cell bitlines and produce either a logic "1" or "0" differential voltage at the sense amp terminals. Since reading the cell data is a destructive operation, the sensed data is then restored to the cell following each read operation by application of another pulse to the cell platelines while the sense amp retains the latched data on the bitlines. To write data to the cell, an electric field is applied to the cell capacitor by a sense amp or write buffer in combination with a plateline activation pulse to polarize the capacitor to the desired data state.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to the first sides of the ferroelectric cells in a data row, the other sides of which are connected to the array bitlines to receive the data. In a read operation, the decoder provides plateline pulses to the first side of each ferroelectric memory cell in a data row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

During a read operation in a typical folded-bitline array, a signal level $V_1$ or $V_0$ is obtained on the array data bitline, depending upon the state of the data being read from the cell (e.g., binary "1" or "0", respectively). A reference voltage from a shared reference generator is ideally between $V_1$ and $V_0$, which is applied to the complementary bitline (e.g., a 'reference' bitline connected to the other input of the sense amp). To read the data, the cell transistor is turned on by applying a wordline activation voltage to the transistor gate to couple the cell capacitor to the data bitline. The plateline is then pulsed high, to cause charge sharing between the ferroelectric cell capacitor and the capacitance of the data bitline, by which the data bitline voltage rises, depending upon the state of the cell data being read. The plateline is then returned to 0V and the sense amp is activated, either during the plateline pulse ("step-sensing" or "on-pulse sensing") or after the plateline signal is brought low (e.g., "pulse sensing" or "after-pulse sensing"). Following a cell data read, the data is restored to the cell by again pulsing the plateline high and then low while the wordline is asserted to reprogram the ferroelectric cell capacitor.

A continuing trend in the semiconductor device manufacturing industry is known as scaling, wherein components and interconnections in integrated circuits are scaled to ever higher density using smaller feature sizes. Another related trend is the reduction in voltage levels used in integrated circuits. For instance, whereas 3.3 V is typically found in devices fabricated using 0.25 um technology, only 1.5 V is typically found in 0.13 um devices. In conventional ferroelectric memory devices, the plateline pulse is generated from the supply voltage VCC. However, because the voltage across the cell capacitor during the plateline pulse is the difference between the plateline voltage and the data bitline voltage, the plateline pulse signal itself needs to be much higher than the coercive or saturation voltage of the capacitor. Reducing the device supply voltage thus makes it more difficult to ensure proper ferroelectric memory operation, since the thickness of the ferroelectric cell capacitors must continually be decreased in order for the ferroelectric capacitor to switch and therefore be useful as a memory element. Reducing the ferroelectric thickness increases the ratio of non-switched to switched charge in the material.

Several trends are also decreasing the amount of voltage that is available for use across the capacitor. These include decreased supply voltage VCC that is scaling (although not as fast when VCC approaches 1 V) and the need for constant bit line voltage for sensing that is not scaling, wherein the voltage across the capacitor during read operations is VCC−VBL, which is scaling faster than VCC. In addition, as ferroelectric device thickness is decreased in order to scale switching voltage, non-switched charge is increasing with scaling, while the switched charge is at best staying constant. As a result, the bitline voltage during read operations (VBL) is increasing for the same switched charge because the non-switched charge is increasing, whereby the useful voltage across the cell capacitor is effectively further reduced.

One possible approach involves designing voltage boost circuits to generate plateline pulse signals that are above the scaled supply voltage VCC. However, providing special high voltages for plateline pulse drivers increases the device area and cost, and can degrade device reliability. Thus, there is a need for improved ferroelectric memory devices and memory read techniques by which plateline voltage levels can be scaled or reduced for a given ferroelectric capacitor material type, without the need for voltage boost circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods and apparatus for reducing the voltage at a sense amp input terminal and/or for removing charge therefrom during read operations in a ferroelectric memory device prior to applying a plateline signal to a target memory cell. This facilitates reducing the voltage level used in generating the plateline signal while still providing sufficient voltage across the cell capacitor in a read operation. The invention thus allows reduced supply voltages in scaled ferroelectric memories while mitigating the need for voltage boost circuitry to generate proper plateline pulses. The invention may be employed in any type of ferroelectric memory device having any type of cell structure (e.g., 1T1C, 2T2C, etc.) and any type of array architecture (e.g., folded bitline, open bitline, etc.).

One aspect of the invention relates to ferroelectric memory devices, comprising an array of ferroelectric memory cells and a sense amp having an input coupled with a data bitline of the array during a memory read operation. A reference generator system is coupled with the sense amp, which removes charge from the sense amp data input prior to application of a plateline signal to a target cell capacitor. In one example, the reference generator system comprises a charge storage device, such as one or more ferroelectric capacitors, as well as a switching system that selectively couples the charge storage device to the sense amp input prior to application of the plateline signal to remove charge from the sense amp input. The charge storage device may comprise a variable capacitance to remove a variable or programmable amount of charge from the sense amp input.

In one implementation, the charge storage device comprises a plurality of ferroelectric capacitors, with a selection system to selectively couple one or more of the capacitors with the switching system to provide a variable capacitance. In this example, the charge storage device comprises first and second terminals, wherein the switching system couples the first terminal to a first voltage and couples the second terminal to a second voltage higher than the first voltage so as to precharge the charge storage device. The switching system then decouples the second terminal from the second voltage, couples the first terminal to the sense amp input, and couples the second terminal to the first voltage prior to the plateline signal being applied to the selected cell capacitor so as to remove charge from the first sense amp input and/or to reduce the voltage thereof. In this example, the reference generator system may thus provide a negative voltage to the sense amp input prior to application of a plateline signal, whereby the voltage across the cell capacitor is increased during the read operation. The reference generator system may also provide a reference voltage to a second sense amp terminal during the memory read operation, which may also be variable or programmable, and which can be positive, ground, or negative.

Another aspect of the invention provides a ferroelectric memory device, comprising a ferroelectric memory array, a sense amp, and a reference generator system, wherein the reference generator system provides a negative voltage to a first sense amp input during a memory read operation prior to application of a plateline signal to the target cell capacitor.

Yet another aspect of the invention provides a reference generator system for a ferroelectric memory device, where the reference generator system comprises a charge storage device and a switching system operable to selectively couple the charge storage device to a first sense amp input during a memory read operation prior to application of a plateline signal to a ferroelectric memory cell being read. The charge storage device may comprise a variable capacitance operable when coupled with the first sense amp input to provide a negative voltage to the first sense amp input. In one implementation, the charge storage device comprises first and second terminals, wherein the switching system couples the first terminal to a first voltage and couples the second terminal to a higher second voltage, and then decouples the second terminal from the second voltage, couples the first terminal to the first sense amp input, and couples the second terminal to the first voltage prior to the plateline signal.

Other aspects of the invention provide methods for reading data from a target ferroelectric memory cell. One method comprises removing charge from a first sense amp input, coupling a first terminal of a target ferroelectric memory cell capacitor to the first sense amp input, providing a plateline signal to a second terminal of the target ferroelectric memory cell capacitor after removing charge from the first sense amp input, and sensing data from the target ferroelectric memory cell capacitor. Another method of the invention comprises applying a negative voltage to a first sense amp input, coupling a first terminal of a target ferroelectric memory cell capacitor to the first sense amp input, providing a plateline signal to a second terminal of the target ferroelectric memory cell capacitor after applying the negative voltage to the first sense amp input, and sensing data from the target ferroelectric memory cell capacitor.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
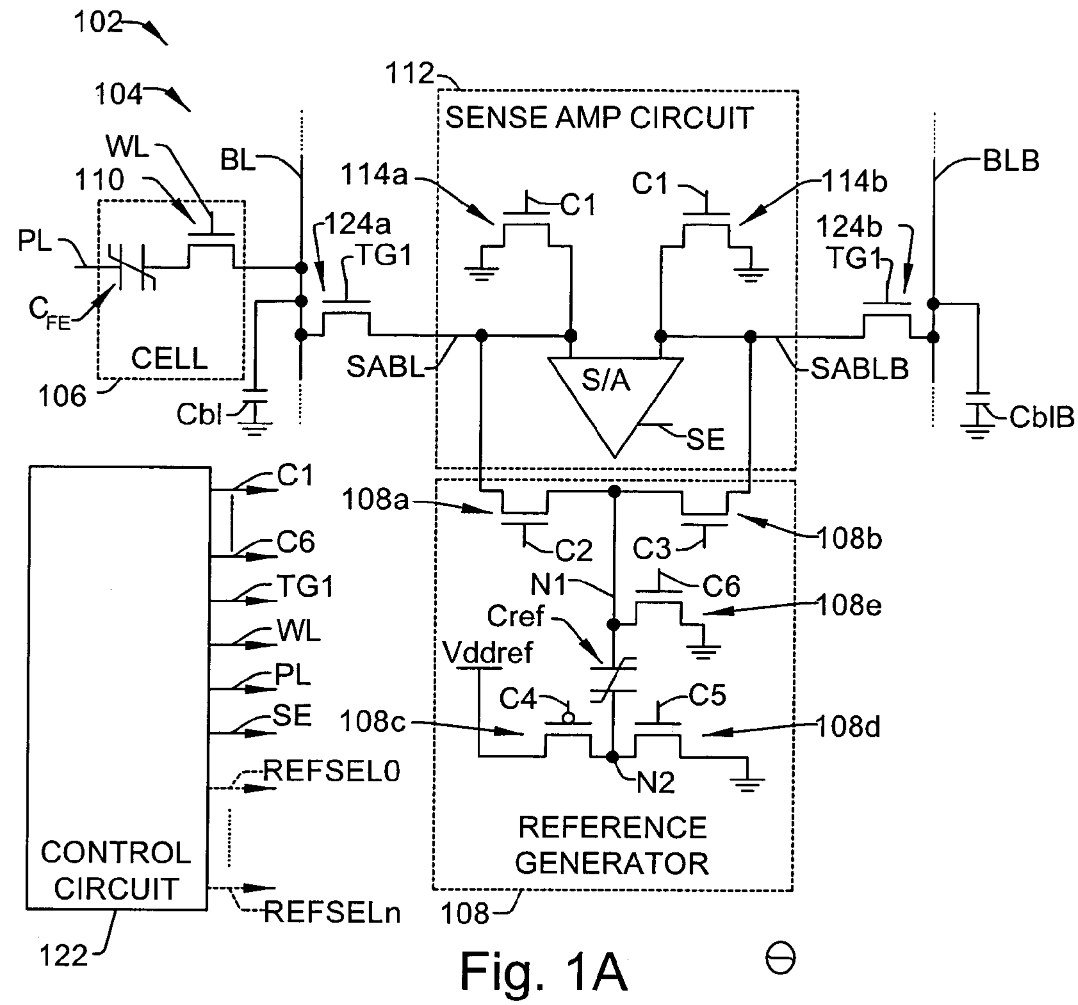
FIG. 1A is a schematic diagram illustrating a portion of a ferroelectric memory device with an array of ferroelectric memory cells, a sense amp, and an exemplary reference generator system having a charge storage device and a switching system in accordance with one or more aspects of the present invention.

One or more implementations of the present invention will now be described with reference to the attached drawings, wherein like reference numerals are used to refer to like elements throughout, wherein the timing diagrams and waveforms thereof are not necessarily drawn to scale.

The invention relates to methods and apparatus for reading ferroelectric memory data that facilitate provision of acceptable voltage levels across ferroelectric cell capacitors even when device operating voltages are reduced or scaled to ensure correct memory operation while mitigating the need for voltage boost circuitry. Various aspects of the invention are hereinafter illustrated and described in the context of exemplary folded bitline type ferroelectric memory devices having single transistor, single capacitor (e.g., 1T1C) cells with plate groups in which several rows of cells share a common plateline driver. However, the invention is not limited to the illustrated implementations, and alternate implementations are possible using any type of cell structure (e.g., 1T1C, 2T2C, etc.), any type of array architecture (e.g., folded bitline, open bitline, etc.), and grouped or individually driven platelines, wherein all such variant implementations are contemplated as falling within the scope of the present invention and the appended claims.

Figure 1B:
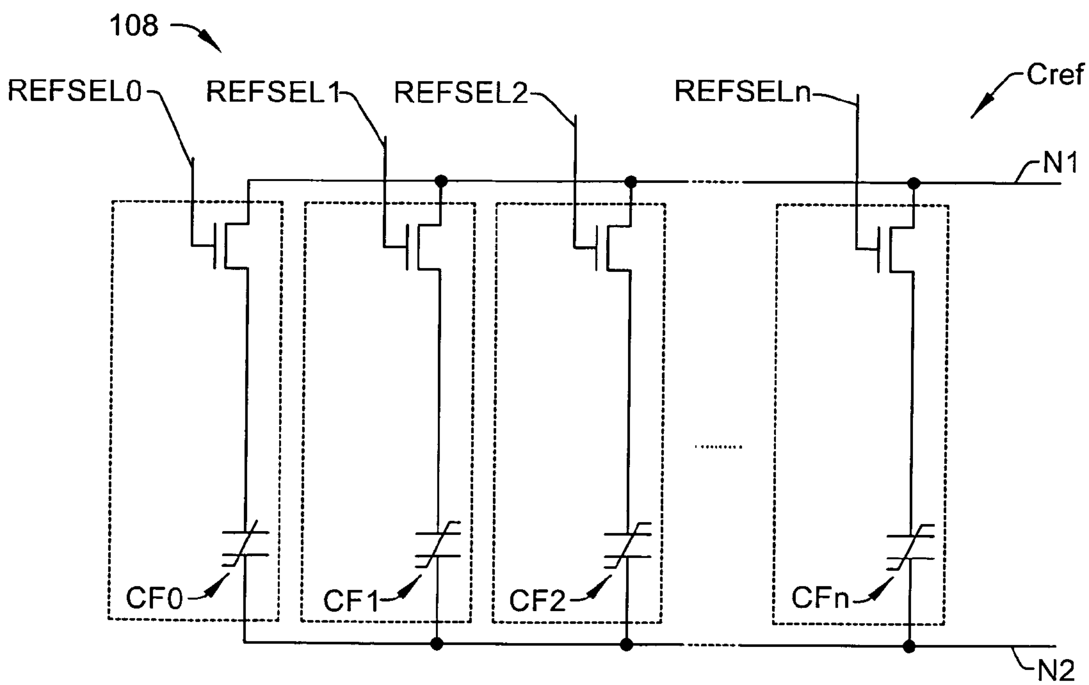
FIG. 1B is a schematic diagram illustrating one example of the charge storage device in the system of FIG. 1A, comprising a plurality of selectable ferroelectric capacitors forming a variable or programmable charge storage device.
Figure 1C:
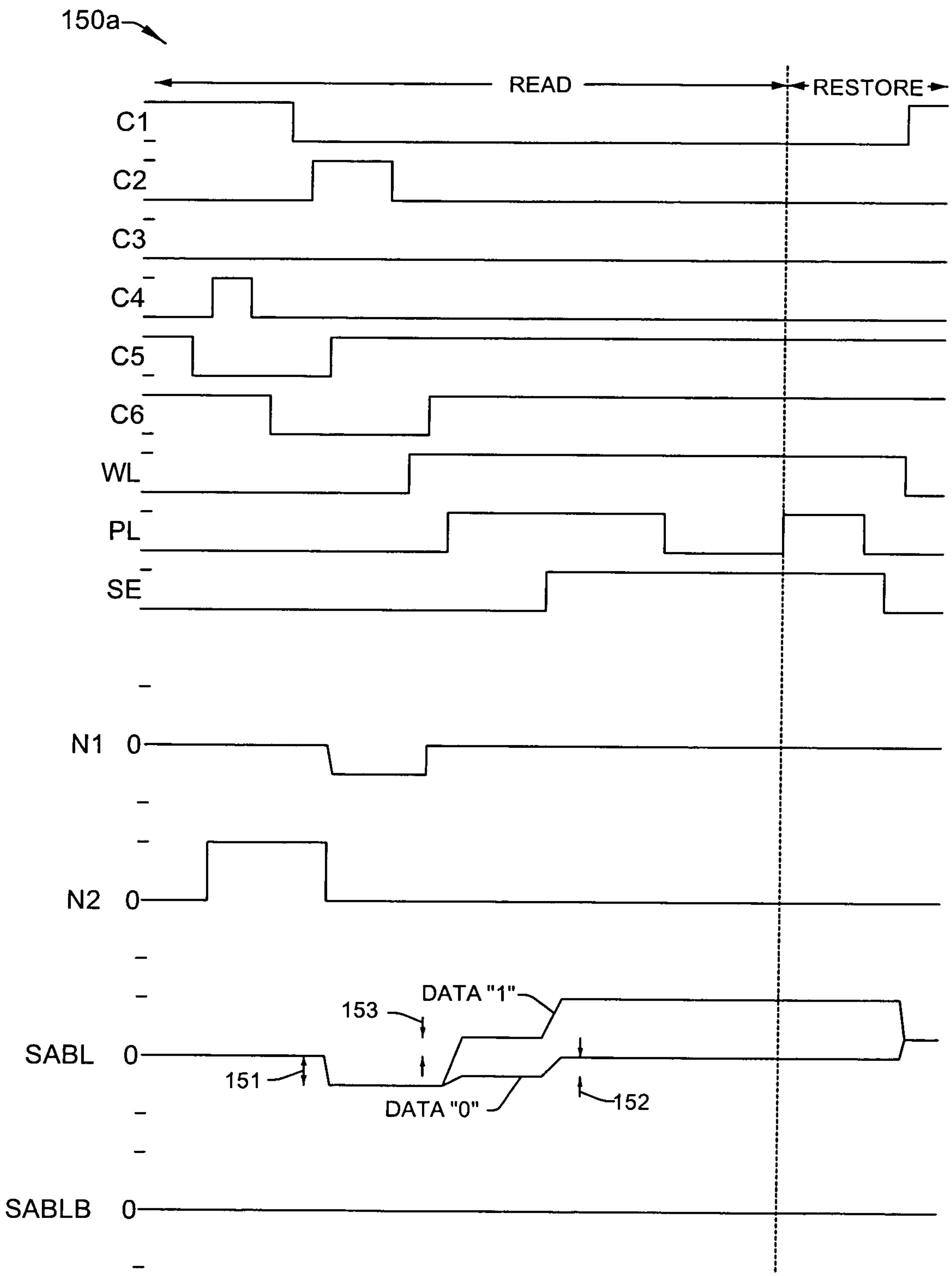
FIG. 1C is a timing diagram illustrating various control and signal waveforms during a read operation in the device of FIGS. 1A and 1B.
Figure 5:
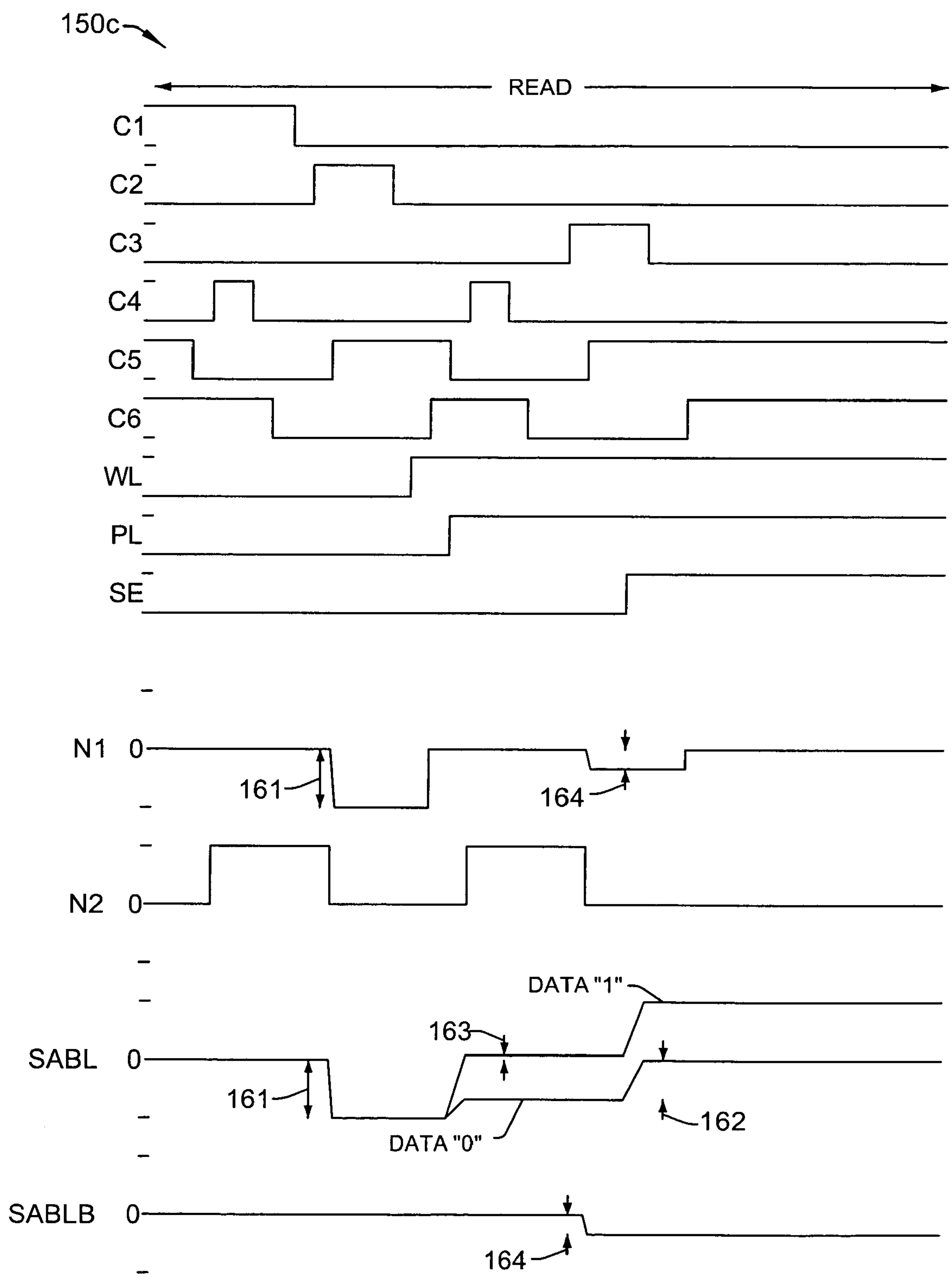
FIG. 5 is a timing diagram illustrating various control and signal waveforms during a read operation in an alternate operation of the device of FIGS. 1A and 1B.

Referring initially to FIGS. 1A–1C, an exemplary ferroelectric memory device 102 is illustrated having a reference generator system 108 in accordance with one or more aspects of the invention. The device 102 comprises a folded bitline array 104 of 1T1C ferroelectric memory cells 106 arranged in rows along wordlines WL and platelines PL, and columns along complementary array bitline pairs BL/BLB with individual bitline capacitances Cbl and CblB, respectively. A control system or circuit 122 is coupled with the array 104 and operates to generate wordline and plateline signals according to decoded address information or signals for read, restore, and write operations as described hereinafter. Individual array columns are selectively coupleable to shared sense amp circuits 112 and reference generator systems 108 via transfer gate (e.g., TGATE) select transistors 124*a* and 124*b* according to a control signal TG1, wherein the transistors 124 selectively couple array bitlines BL/BLB to corresponding shared sense amp bitlines SABL/SABLB that provide first and second sense amp inputs. Various exemplary waveforms and signals are illustrated in the timing diagram of FIG. 1C for an exemplary memory read operation in the device 102. FIG. 5 provides a timing diagram illustrating one possible alternative operation of the device of FIGS. 1A and 1B, as described further below.

The individual ferroelectric memory cells 106 comprise a ferroelectric cell capacitor $C_{FE}$ and a cell transistor 110. The cell capacitors $C_{FE}$ comprise a first terminal coupled to the transistor 110 and a second terminal coupled to a plateline driver PL, where the cell transistor 110 selectively couples the first capacitor terminal to a corresponding array bitline BL when selected by the corresponding wordline signal WL from the control circuit 122. When the cell 106 is thus coupled with the bitline BL, this bitline is known as the 'data bitline', while the complementary array bitline BLB is used for providing a reference voltage to the second sense amp terminal SABLB, and is thus referred to as the 'reference bitline'. In the exemplary folded bitline array 104 illustrated and described herein, the array bitlines BL/BLB each operate as data bitlines and reference bitlines depending on what row of cells 106 is being targeted (e.g., selected) for a given memory access operation in the device 102. Thus, where the illustrated cell 106 in FIG. 1A is the target cell, the bitline BL is the data bitline and the bitline BLB is the reference bitline, wherein the opposite is true when cells along BLB are being accessed.

As illustrated in FIG. 1A, the sense amp circuit 112 comprises a sense amp S/A that senses and amplifies a differential voltage on the sense amp inputs SABL/SABLB according to one or more sense amp enable signals SE from the control circuit 122 during memory access operations. The exemplary sense amp circuit 112 also comprises precharge transistors 114*a* and 114*b* to selectively precharge the sense amp inputs SABL and SABLB to a known voltage level (e.g., ground in the illustrated implementation) according to a precharge control signal C1 from the control circuit 122. Any suitable sense amp may be employed within the scope of the invention to sense data from a targeted (e.g., selected) ferroelectric memory cell, including but not limited to single-ended and differential sense amps. A more detailed illustration and description of the exemplary differential sense amp circuit 112 is provided below with respect to FIG. 2G.

The reference generator system 108 is coupled with the sense amp 112 and generally operates to remove charge from and/or to lower the voltage of the first sense amp input SABL in a memory read operation before the plateline signal PL is applied to the second terminal of the cell capacitor $C_{FE}$. Any suitable reference generator system may be employed, that is operable to remove or extract charge from a sense amp input (e.g., and/or from a data bitline coupled with the sense amp input) and/or to lower a voltage thereof prior to assertion of a corresponding plateline signal, which may provide a negative voltage to the sense amp input within the scope of the invention. The lowering of the sense amp input terminal voltage and/or the removal of charge therefrom advantageously increases the amount of voltage applied across the targeted cell capacitor CFE for a given plateline signal voltage level, thereby facilitating scaling of the device operating voltages while mitigating the need for voltage boost circuitry.

The exemplary reference generator system 108 comprises a charge storage device Cref having first and second terminals coupled with nodes N1 and N2, respectively, and a switching system that operates to selectively couple Cref to the sense amp input SABL during read operations targeting cells along the corresponding array data bitline prior to the plateline signal. The exemplary switching system comprises transistors 108*a*–1 08*e* coupled with the charge storage device Cref and the sense amp 112 that operate according to signals C2–C6, respectively, from the control circuit 122, although any suitable switching system may be employed within the scope of the invention to selectively couple Cref to the sense amp input SABL during read operations. As discussed further below with respect to FIG. 5, the reference generator system 108 advantageously removes charge from a sense amp input SABL or SABLB to facilitate provision of sufficient voltage across a cell capacitor $C_{FE}$ in read operations, and may also provide a reference voltage to a second sense amp input during the memory read operation, where the reference voltage can be positive or negative (e.g., or ground), and may be variable or programmable.

In operations targeting cells 106 along the array bitline BL, the transistor 108*a* selectively couples the first terminal node N1 to the first sense amp input terminal SABL to extract charge therefrom and/or to reduce the voltage thereof, whereas the transistor 108*b* operates in similar fashion to couple N1 to the second sense amp terminal SABLB for operations targeting cells 106 along the complementary array bitline BLB. As discussed further below with respect to FIG. 5, moreover, the reference generator system 108 may also operate to provide voltage reduction/charge removal via transistor 108*a* with respect to the first sense amp input SABL and also to provide a reference voltage to the other input SABLB via the transistor 108*b* in a single memory read operation. The transistor 108*c* of the exemplary switching system selectively couples the second terminal node N2 with a positive supply voltage Vddref according to the control signal C4 and the transistor 108*d* couples N2 to ground according to the control signal C5. The transistor 108*e* selectively couples the first node N1 to ground according to the control signal C6.

Referring also to FIG. 1C, an exemplary timing diagram 150*a* is provided, illustrating various control signals and voltages at various nodes in the device 102 of FIG. 1A during a read operation targeting the illustrated cell 106, wherein the transfer gate transistors 124*a* and 124*b* are on throughout (e.g., signal TG1 asserted high). In a read operation, the switching system couples N1 to a first voltage (e.g., to ground via transistor 108*e* and signal C6) and couples N2 to a second higher voltage (e.g., to Vddref using transistor 108*c* via signal C4). Then, the second terminal N2 is decoupled from the second voltage Vddref (e.g., by turning off transistor 108*c*) and the first terminal N1 is coupled with the first sense amp input SABL using transistor 108*a* (e.g., via signal C2). In addition, the second terminal N2 is coupled to the first voltage (e.g., ground) using the transistor 108*d* according to the signal C5 prior to application of the plateline signal PL to the cell capacitor $C_{FE}$.

Because the capacitor Cref was precharged and then coupled to the sense amp input SABL as described above, charge is extracted or removed from SABL, and thereby reduces the voltage thereof. In the illustrated example, moreover, since the sense amp input SABL was initially precharged via the transistor 114*a* to ground, the removal of charge from SABL via the reference generator system 108 provides a negative voltage to the sense amp input SABL prior to the plateline signal PL, wherein the wordline signal WL may be asserted to couple the target cell capacitor CFE to the array bitline BL at any time before or after the connection of N1 with SABL via the transistor 108*a*. In the exemplary system 108, the charge storage device Cref is isolated from the sense amp 112 and hence from the data bitline BL by deactivating the transistor 108*a* prior to asserting the wordline WL, so as to prevent an increase in the capacitance Cbl of the array bitline BL prior to turning on the wordline WL.

As seen in the exemplary timing diagram 150*a* in FIG. 1C, the control signal C1 is initially held high, thereby precharging the sense amp inputs SABL and SABLB to ground (e.g., 0 V), with transistors 108*a* and 108*b* initially off to isolate the grounded sense amp inputs SABL and SABLB from the reference generator 108 system. The control signals C5 and C6 are also initially asserted, to hold the terminals N2 and N1 of the charge storage device Cref at ground via transistors 108*d* and 108*e*, respectively (e.g., Cref initially discharged). The control circuit 122 then deactivates C5 to turn off transistor 108*d*, and asserts the signal C4 to turn on the transistor 108*c*, while C6 remains activated. This provides a voltage (e.g., Vddref) across Cref by which the charge storage device Cref is charged up (e.g., the voltage at the second node terminal N2 rises to Vddref). The signals C4 and C6 are then deactivated and C2 is asserted to couple the charged capacitance Cref to the sense amp input SABL via the transistor 108*a*.

Thereafter, C5 is asserted to ground the second terminal node N2. This causes charge to be extracted from the sense amp input SABL, which lowers the sense amp input terminal voltage at SABL to a negative voltage 151 (FIG. 1C). The switching of C2 off and C5 on may be done in any order within the scope of the invention. However, it is noted that turning C2 on (e.g., coupling the sense amp input SABL to the first terminal N1 of the charge storage device Cref) prior to coupling N2 to ground via the signal C5 and transistor 108*d* may advantageously mitigate the extent to which the node N1 goes negative in the exemplary implementation. Activating the signal C5 thus reduces the sense amp input SABL and the data bitline BL to a negative voltage 151 (e.g., Qref/Cbl) by removing charge from the bitline BL to the storage device Cref. After the charge transfer, the signal C2 is deactivated, thereby isolating the charge storage device Cref from the sense amp 112.

Thereafter, the wordline signal WL is brought high, thereby selecting the target cell 106, and the plateline signal PL is applied. Application of the plateline signal provides a voltage across the cell capacitor $C_{FE}$ having an amplitude that is equal to the plateline signal amplitude plus the voltage 151, due to the initial lowering of the data bitline voltage BL through operation of the reference voltage generator system 108 of the present invention. The voltage on the sense amp input terminal SABL then rises by an amount dependent on the data stored in the cell 106, as illustrated in FIG. 1C, wherein the voltage SABL rises to a small negative voltage 152 for cell data "0" or to a small positive voltage 153 for cell data "1".

The cell data is then sensed by enabling the sense amp S/A via the signal SE. Assertion of the sense amp enable signal SE causes the sense amp S/A to amplify and latch the sensed data, wherein the sense amp inputs SABL/SABLB are brought to a supply voltage VCC or to ground, depending on the sensed data state. Although illustrated using "on-pulse" sensing wherein the sense amp S/A is enabled while the plateline signal pulse PL is still high, other implementations are possible using 'after-pulse' sensing, in which the sense amp is enabled after the plateline signal PL is again brought low. Following the deactivation of the signal C2, the signal C6 is again asserted to discharge the charge storage device Cref. The sensed data is then restored to the cell 106 by application of another plateline pulse PL as illustrated in FIG. 1C, after which the sense amp S/A is again disabled (e.g., SE brought low), and the wordline signal WL is deactivated.

In the illustrated example, the signal C3 remains deactivated during the read operation (e.g., the transistor 108*b* is off), whereby the reference bitline SABLB remains essentially at ground potential, subject to parasitic fluctuations after the associated precharge transistor 114*b* is turned off. Thus, the reference voltage at the second sense amp input terminal SABLB is essentially ground, wherein the values of the switching circuit first voltage Vddref and the capacitance of the charge storage device Cref are preferably selected or adjusted such that the data "0" voltage 152 and the data "1" voltage 153 are of about the same amplitude but are of opposite polarity, whereby the reference voltage 0V is approximately midway between the voltages 152 and 153. In this regard, the exemplary reference generator system 108 of FIG. 1A may be advantageously employed in open bitline array architectures in which a single ended sense amp S/A is employed or in other situations in which it is desirable to use sense amps that are not connected to a reference bitline.

Referring also to FIG. 1B, another aspect of the invention provides for variation or programmability of various voltages and/or capacitances in the reference generator system 108. Toward that end, the charge storage device Cref may comprise a variable capacitance that allows removal of a programmable or variable amount of charge from the first sense amp input SABL when coupled to the sense amp 112. As illustrated in FIG. 1B, the charge storage device Cref in this implementation comprises a plurality of n capacitors CF0–CFn having first terminals coupled with corresponding selection transistors, and second terminals coupled with the node N2. The selection transistors form a selection system, wherein the control system 122 provides select signals REFSEL0–REFSELn to selectively couple one or more of the plurality of capacitors CF0–CFn with the first node N1 of the switching system to provide a variable capacitance Cref. The capacitors CF0–CFn may be any type of capacitors within the scope of the invention, including but not limited to ferroelectric capacitors (e.g., as illustrated in FIG. 1B), MOS capacitors, capacitors formed with standard dielectric materials between conductive electrodes (e.g., non-ferroelectric dielectric materials such as silicon oxynitride SiON, etc.), or others. The selection of which of the capacitors CF0–CFn are switched into the circuit may be done according to measurements made during fabrication, for example, using e-fuses or other one time programmable circuit elements in the control circuit 122, or may be reprogrammable. Alternatively or in combination with programming during production, the programmable selection of capacitors (e.g., CF0–CFn) to provide the capacitance Cref can be accomplished after fabrication, for example, via programmable circuit elements such as user-programmable registers in the ferroelectric memory.

Referring now to FIGS. 2A–2H, further details of the exemplary ferroelectric memory device 102 are provided, wherein the device 102 is organized as a folded bitline type memory array with 1T1C cells, with the cell rows being configured in plate groups in which several rows of cells share a common plateline driver. However, the invention is not limited to this device design, and devices having any cell types, array types, and plateline driver configurations are possible within the scope of the invention. In the exemplary device 102, multiple rows of cells 106 are driven by shared plateline drivers 119, wherein the cell rows sharing a common plateline driver 119 are referred to below as a plate group 111. The device 102 comprises an array 104 of ferroelectric memory cells 106 (FIG. 2E) arranged in rows and columns, along with a control system or circuit 122 (FIG. 2H) coupled with the array 104 to generate wordline and plateline signals according to decoded address information or signals for read, restore, and write operations. In addition, the control circuit 122 provides the above described control and timing signals for operation of the reference generator system 108 of the invention, wherein the control circuit can be fabricated from any suitable analog and/or logic circuitry.

Figure 2A:
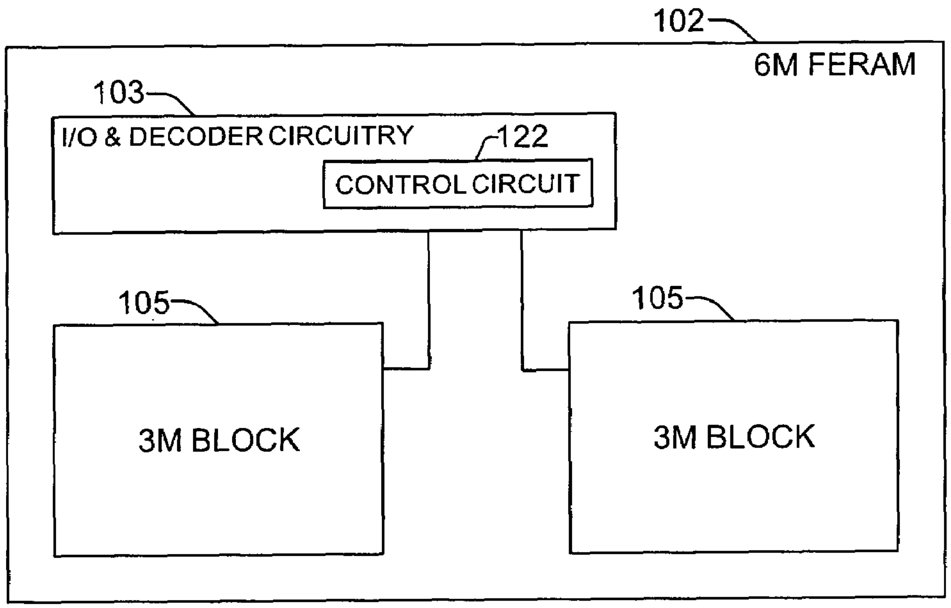
FIGS. 2A–2H are schematic diagrams illustrating an exemplary ferroelectric memory device having a reference generator system in accordance with the invention.
Figure 2B:
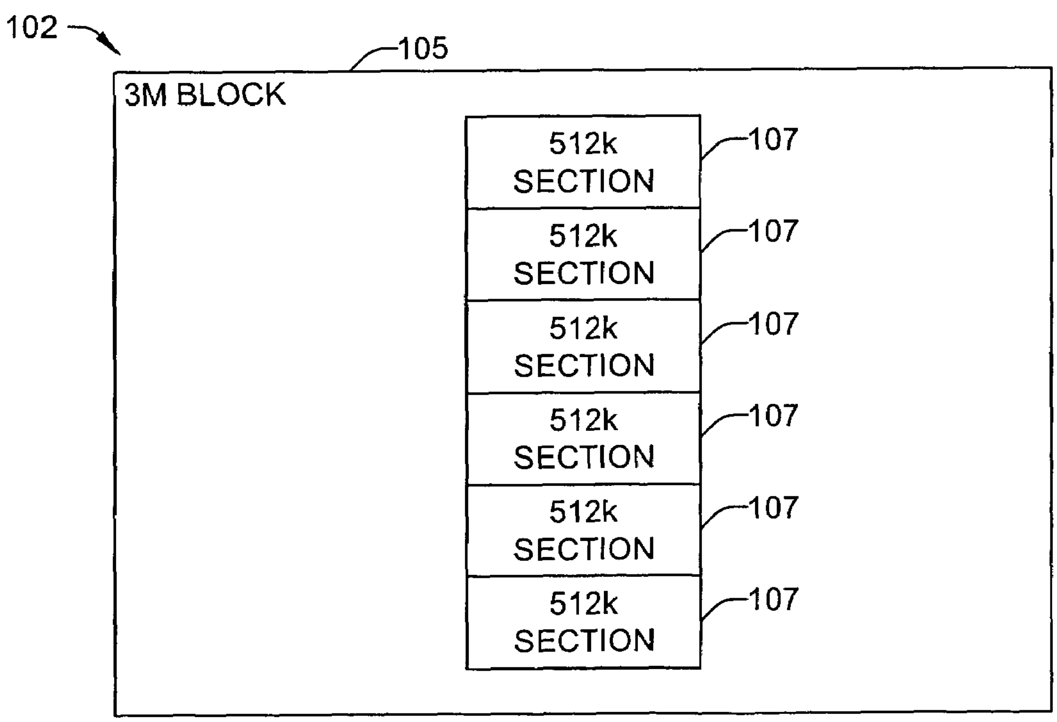
Figure 2C:
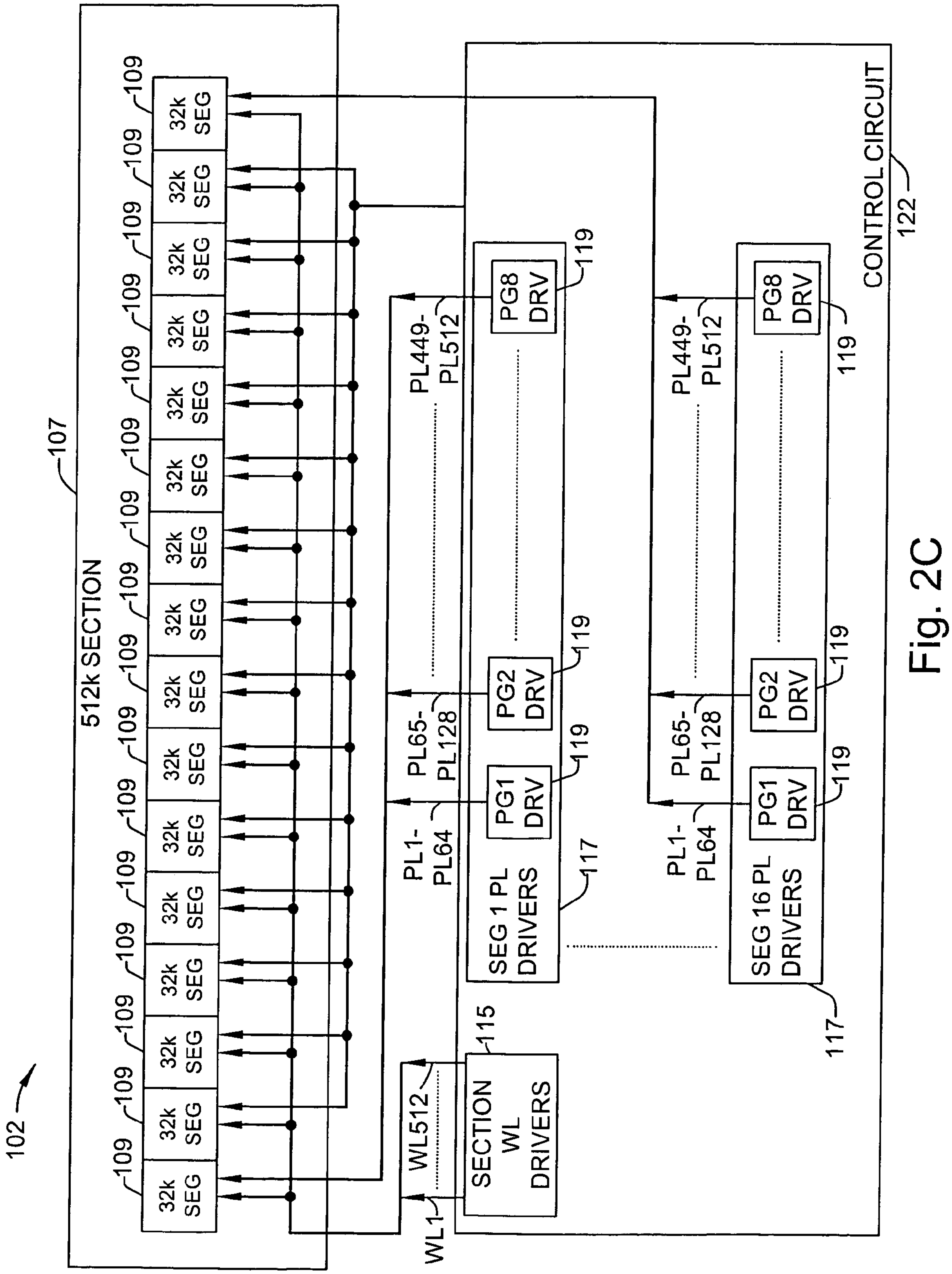
Figure 2D:
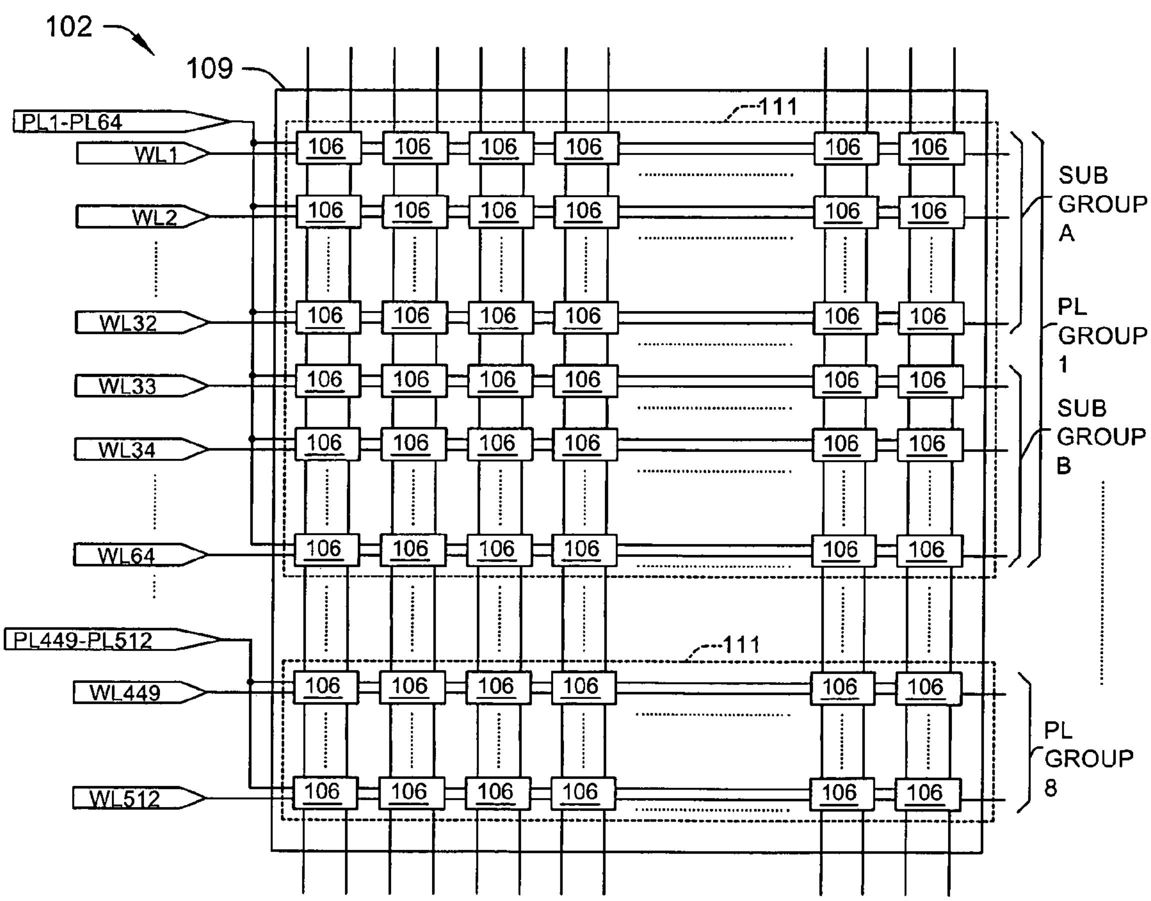
Figure 2E:
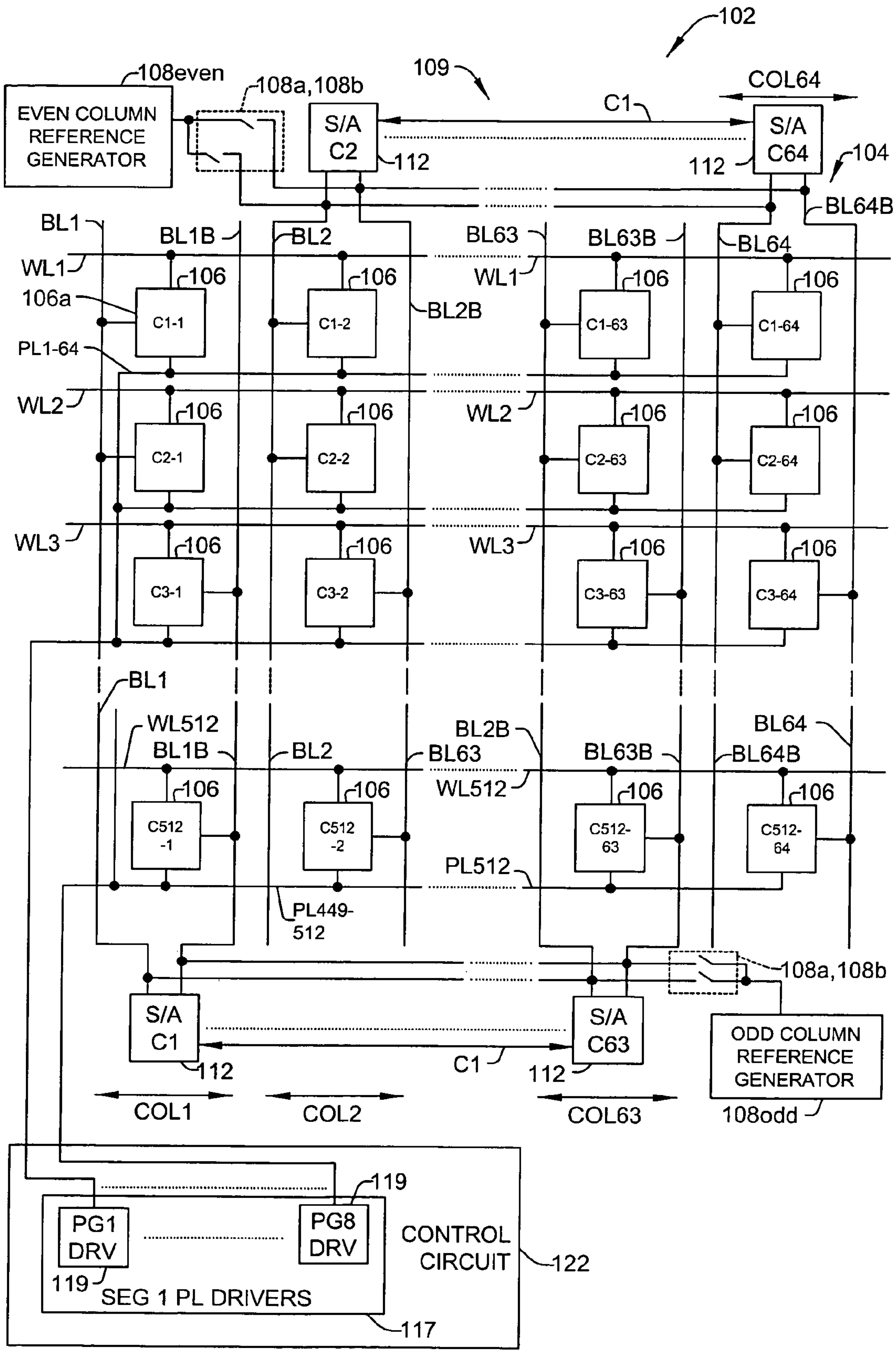
Figure 2F:
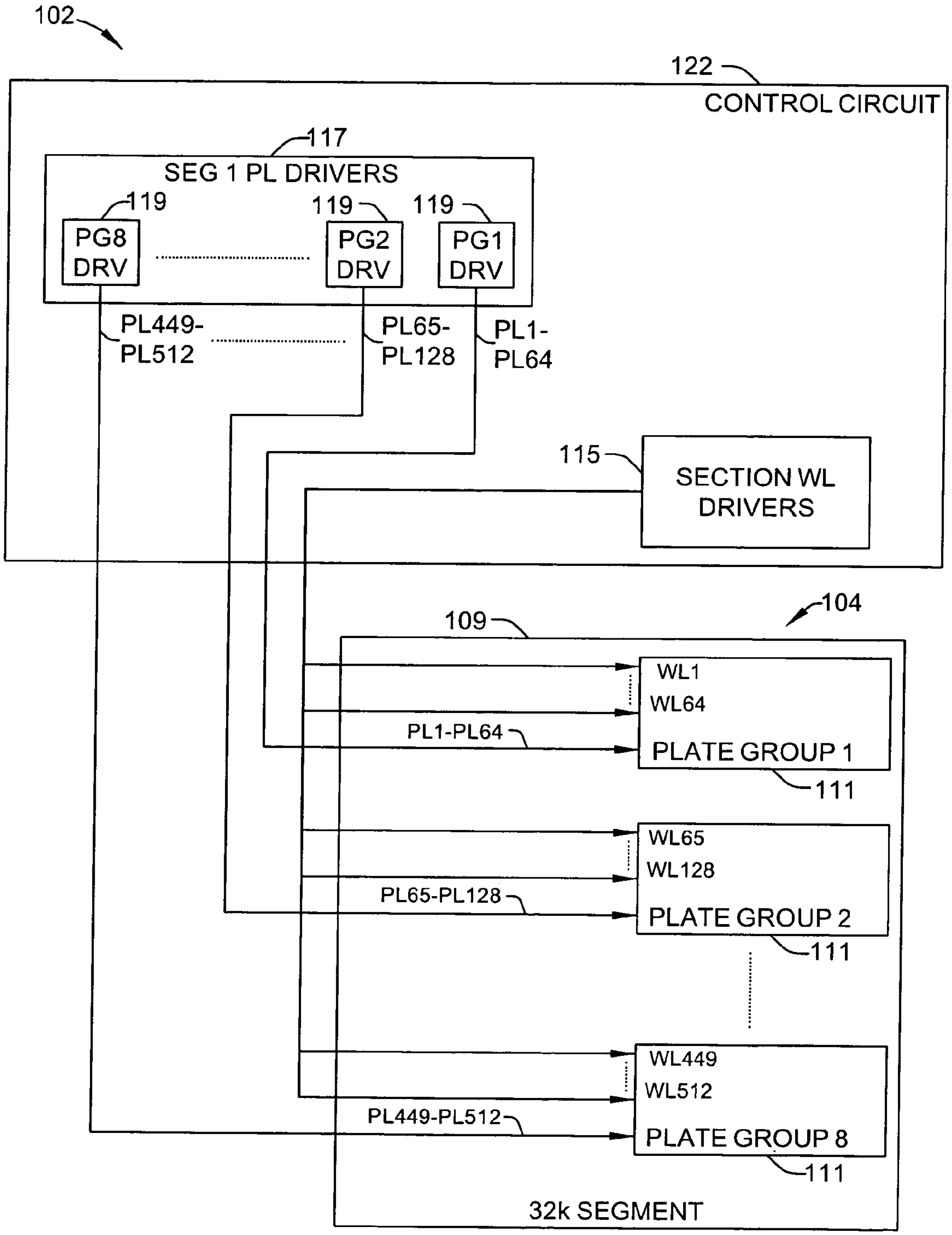

As shown in FIG. 2A, the exemplary device 102 is a 6M ferroelectric memory, including I/O and decoder circuitry 103 that comprises the control circuit 122, as well as two 3M memory blocks 105. The memory blocks 105 are further divided into 6 sections 107 of 512 k each, as shown in FIGS. 2B and 2C. Each section 107 has a corresponding wordline driver circuit or system 115 (FIGS. 2C and 2F) and comprises 16 segments 109 of 32 k each, wherein one such segment 109 is further illustrated in FIGS. 2D and 2E. As shown in FIGS. 2D and 2F, moreover, the memory cells 106 of the exemplary segments 109 are partitioned into plate groups 111 of 64 rows per plate group, where the plate groups 111 may, but need not, extend across multiple segments 109, and where the plate groups 111 are further subdivided into subgroups A and B of 32 rows each. For example, cells along wordlines WL1 through WL32 form a first subgroup A and cells along WL33–WL64 form another subgroup B of a first plate group 111 PL GROUP 1, with the other cells of the illustrated segment 109 being grouped in similar fashion.

In the exemplary device 102, the cell rows, wordlines, and groupings thereof (e.g., plate groups and plate subgroups) extend across (e.g., are shared among) multiple segments 109 within a given section 107, wherein the wordline drivers 115 for the individual sections 107 may comprise part of the control circuit 122. The exemplary device 102, moreover, provides plateline driver circuits or systems 117 that are associated with individual 32*k* segments 109, as illustrated in FIG. 2C. The plateline driver circuit 117 for each segment 109 comprises a plurality of plateline drivers 119 (e.g., PG1 DRV, PG2 DRV, . . . , PG8 DRV in FIG. 2C) which may also form a part of the control circuitry 122, and which are individually associated with corresponding memory segments 109, wherein a given plateline driver 119 is shared within a segment among the rows of cells that form a plate group. FIG. 2E further illustrates one exemplary memory segment 109 in the device 102, and FIG. 2G illustrates an exemplary column in the segment 109, wherein FIG. 2H also illustrates the exemplary control circuit 122 and various control signals 122*a* generated thereby.

As illustrated in FIG. 2E, the exemplary device 102 comprises a folded bitline ferroelectric memory array 104, reference generators 108 even and 108 odd coupled with the complementary bitline pairs BL1/BL1B through BL64/BL64B along columns of the array 104 via the switches 108*a* and 108*b*, and sense amps 112. TGATE select circuits 124 are provided for each column to selectively couple the sense amps 112 and the inputs SABL/SABLB thereof with the array bitlines of the illustrated segment 109, thus allowing sharing of the sense amps 112 across multiple array segments 109. The illustrated segment 109 comprises 1T1C ferroelectric data memory cells 106 organized in rows along wordlines WL1–WL512 and columns along complementary data bitline pairs BL/BLB in a folded bitline configuration, wherein the wordlines WL1–WL512, shared plateline signals PL1–PL512, and other control and timing signals 122*a* are provided by the control circuit 122 (FIG. 2H).

In the exemplary array segment 109, the memory cells along WL1 and WL2 (as well as those along WL5, WL6, WL9, WL10, . . . ,WL509, WL510) are coupled with bitlines BL1–BL64, whereas cells along WL3 and WL4 (as well as those along WL7, WL8, WL11, WL12, . . . , WL511, WL512) are coupled with the complementary bitlines BL1B-BL64B. In reading the first data word along the wordline WL1, the cells C1-1 through C1-64 of FIG. 2E are connected to the sense amps via the data bitlines BL1, BL2 . . . , BL63, and BL64 while the complementary reference bitlines BL1B, BL2B . . . , BL63B, and BL64B are connected to the reference voltage generators 108 even, 108 odd. The wordline numbering of the device 102 is exemplary only, wherein other wordline/row organizations are possible within the scope of the invention. Also, as mentioned above, open bitline architectures are also contemplated within the scope of the invention.

Figure 2G:
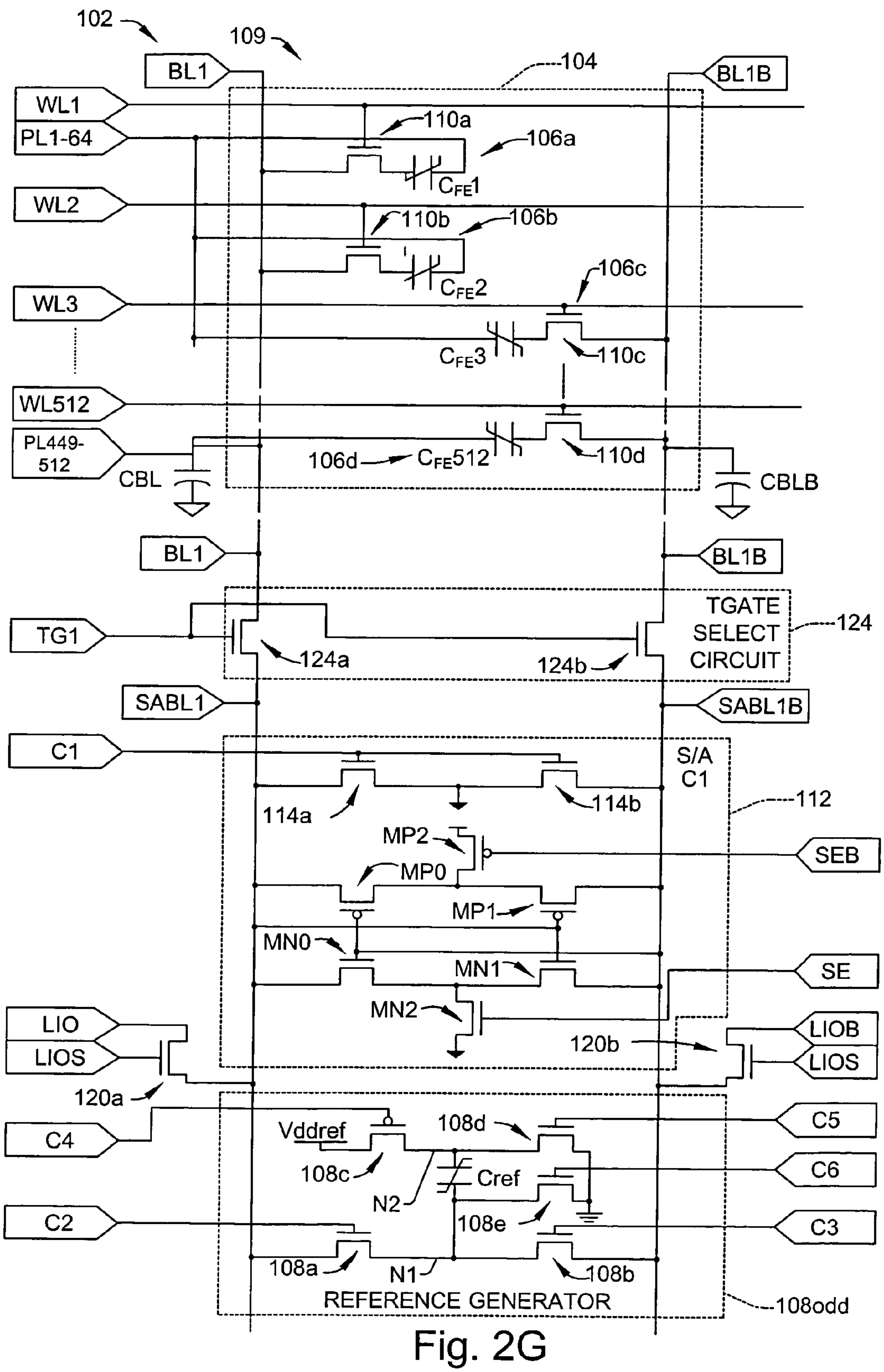

FIG. 2G illustrates further details of the first column of the segment 109 along the array bitline pair BL1/BL1B, in which several exemplary ferroelectric memory data cells 106*a*–106*d* are illustrated comprising ferroelectric capacitors $C_{FE}$1–$C_{FE}$512 and n-channel (NMOS) cell access transistors 110*a*–110*d* configured in the first column along the bitlines BL1 and BL1B, wherein the exemplary segments 109 include 64 such columns. The ferroelectric cell capacitors $C_{FE}$ may be fabricated from any appropriate ferroelectric material in a wafer, such as $Pb(Zr,Ti)O_3$ (PZT), (Ba,Sr)$TiO_3$ (BST), $SrTiO_3$ (STO), $SrBi_2Ta_2O_9$ (SBT), $BaTiO_3$ (BTO), $(Bix\text{-}Lay)_4Ti_3O_{12}$(BLT), PZT doped with a donor (e.g., La, Nb, etc.) and/or with one or more acceptors (e.g., Mn, Ni, Al, etc.) and/or with isovalent dopants (e.g., such as Sr, Ca, etc.), wherein such dopant concentrations are typically about 5% or less, PZT doped with another perovskite as an alloy, or any other type of ferroelectric material fabricated between two conductive electrodes to form a ferroelectric capacitor $C_{FE}$.

Figure 2H:
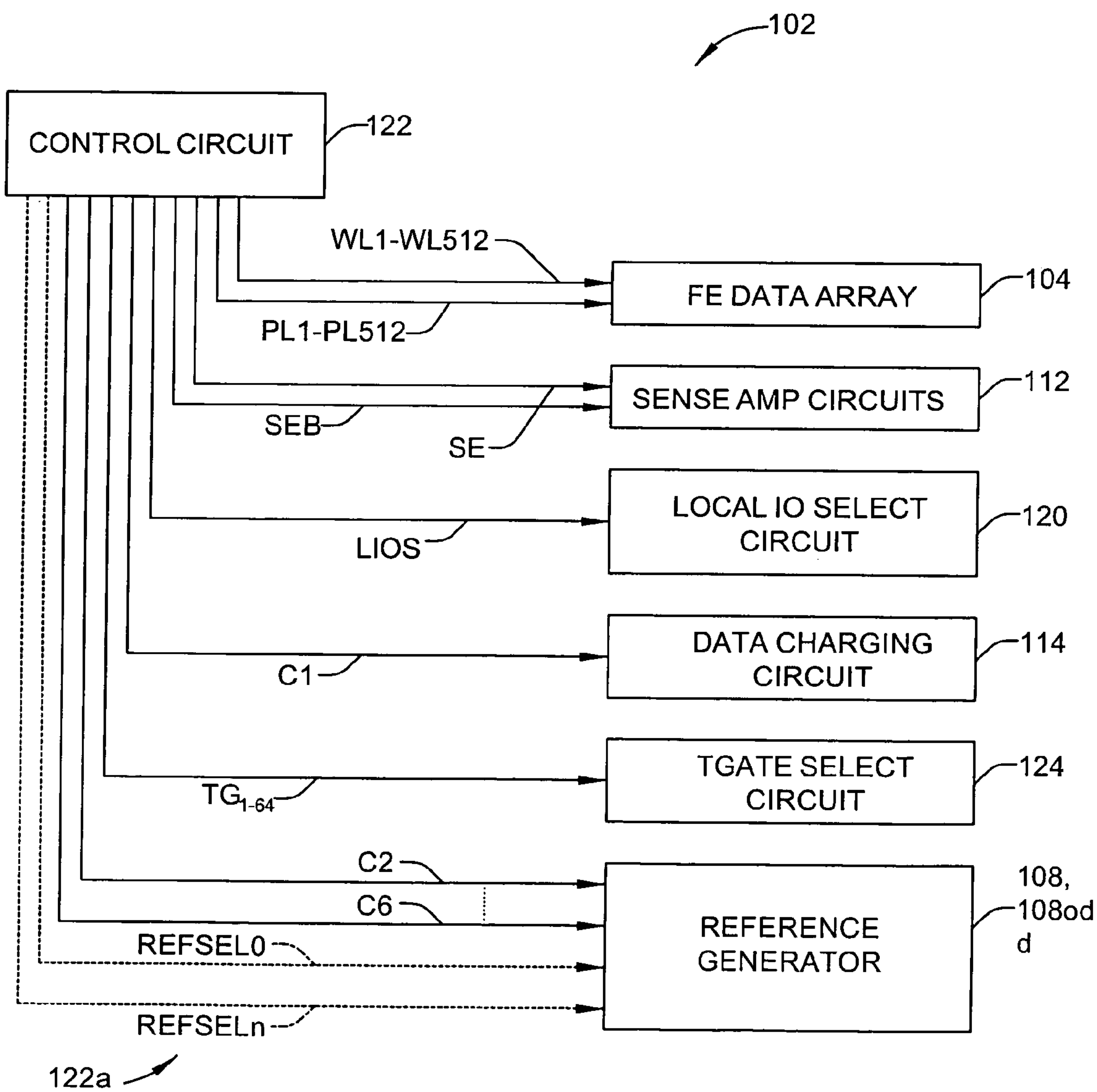

The cells 106*a*–106*d* of FIG. 2G and the contents thereof are accessed during read, restore, and write operations via the array bitlines BL1 and BL1B through activation of the wordline and plateline signals WL1–WL512 and PL1–PL512, respectively, by the control circuit 122 of FIG. 2H. The ferroelectric capacitor CFE1 of the first row is coupled with the bitline BL1 via the first wordline signal WL1 and an access transistor or pass gate 110*a*, and the cell capacitor CFE1 is accessed via activation of a cell plateline signal (e.g., pulse) PL1 from the control system 122. To read the first row of data, the array bitlines BL1/BL1B are precharged to ground (e.g., Vss or 0 V) via a C1 signal from the control system 122 using transistors 114*a* and 114*b* in the shared sense amp circuit 112, and the reference generator systems 108 operate to remove charge from and/or lower the voltage of the sense amp data inputs as described above. The selected plateline (e.g., PL1 for reading the first row) is the pulsed (e.g., brought to Vdd or some other positive voltage) to create a voltage across the cell capacitor $C_{FE}$1, wherein the operation of the reference generator systems 108 of the invention aid in providing sufficient voltages across the cell capacitors $C_{FE}$. The plateline pulse PL1 thus causes charge to be transferred from the cell capacitor $C_{FE}$1 during a read operation, whereby a voltage is established on the bitline BL1 that is representative of the data stored in the cell 106*a*.

The sense amps 112 are then enabled via signals SE and SEB (FIG. 2G) before or after bringing the plateline voltage PL1 back to Vss (during the PL pulse in the illustrated examples). This causes the sense amp 112 to sense the differential voltage on the bitline pair BL1/BL1B to ascertain the data state stored in the target cell 106*a*. The data may then be transferred to I/O circuitry via local I/O data lines LIO/LIOB according to a signal LIOS to turn on I/O access transistors 120*a* and 120*b*. During read and other memory access operations, the sense amp 112 and the sense amp bitlines SABL/SABLB thereof are coupled with the array bitlines BL1/BL1B via the transistors 124*a* and 124*b* in a TGATE select circuit 124 according to a signal TG1 from the control system 122. The exemplary sense amp 112 of FIG. 2G comprises NMOS transistors MN0, MN1, and MN2 as well as PMOS transistors MP0, MP1, and MP2. The sense amp 112 is enabled using sense amp enable signals SE and SEB provided by the control circuit 122 to sense amp transistors MN2 and MP2, respectively.

Figure 3:
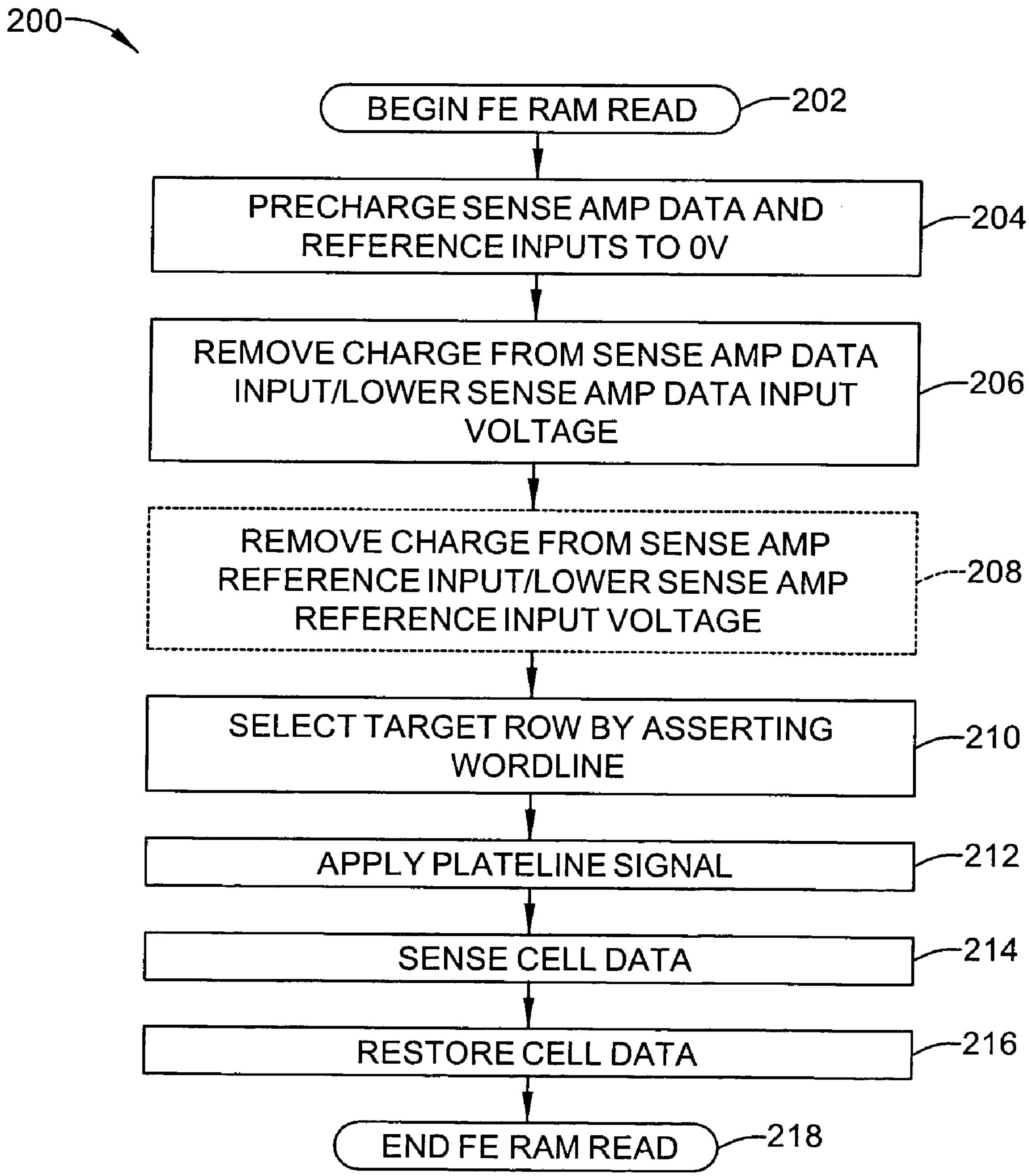
FIG. 3 is a flow diagram illustrating an exemplary method of reading data from a target ferroelectric memory cell in accordance with the invention.

FIG. 3 provides a flow diagram illustrating an exemplary method 200 for reading ferroelectric memory cell data in accordance with further aspects of the invention. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Beginning at 202, the method 200 comprises optionally precharging the first and second (e.g., data and reference) inputs of the sense amp to 0 V at 204 (e.g., grounding the sense amp inputs SABL and SABLB via the transistors 114 in FIG. 1A above). At 206, charge is removed from a first sense amp input and/or the input voltage is reduced at 206 (e.g., lowering the input SABL to a negative voltage 151 in FIGS. 1A and 1C). The removal of charge/voltage reduction at 206 may comprise selectively coupling a charge storage device (e.g., precharged capacitor or capacitors Cref) to the first sense amp input prior to providing a plateline signal to the targeted ferroelectric cell capacitor. For example, in the device 102 above, the charge removal/voltage reduction may comprise coupling a first terminal (e.g., N1) of a charge storage device to a first voltage (e.g., to ground via transistor 108*e* and signal C6) and coupling a second terminal (e.g., N2) to a second higher voltage (e.g., to Vddref via transistor 108*c* and signal C4) to precharge the device Cref. Thereafter, the second terminal N2 is decoupled from the second voltage (e.g., deactivating C4), the first terminal is coupled to the first sense amp input (e.g., via transistor 108_a_ and signal C2), and the second terminal is coupled to the first voltage (e.g., N2 is grounded via transistor 108_d_ and signal C5).

At 208, charge may optionally be removed from a reference input of the sense amp, as illustrated and described further below with respect to FIGS. 4A–4C and 5. The method 200 further comprises coupling a first terminal of the target ferroelectric memory cell capacitor to the first sense amp input at 210, for example, by asserting a wordline signal to activate a targeted cell transistor 110 (FIG. 1A). A plateline signal is then provided at 212 (e.g., PL in FIG. 1A) to a second terminal of the target ferroelectric memory cell capacitor after removing charge/reducing the voltage of the first sense amp input at 206. The cell data is then sensed at 214 (e.g., via sense amp enable signal SE during or following the plateline pulse), and the cell data is then restored at 216, before the read operation method 200 ends at 218. It is noted that the sense amp may be enabled during the time that the plateline is active (e.g., on-pulse sensing while PL is high as shown in FIG. 1C) or alternatively the sense amp may be enabled after the plateline pulse signal (e.g., after-pulse sensing while PL is low), wherein all such variant implementations are contemplated as falling within the scope of the invention and the appended claims.

Figure 4A:
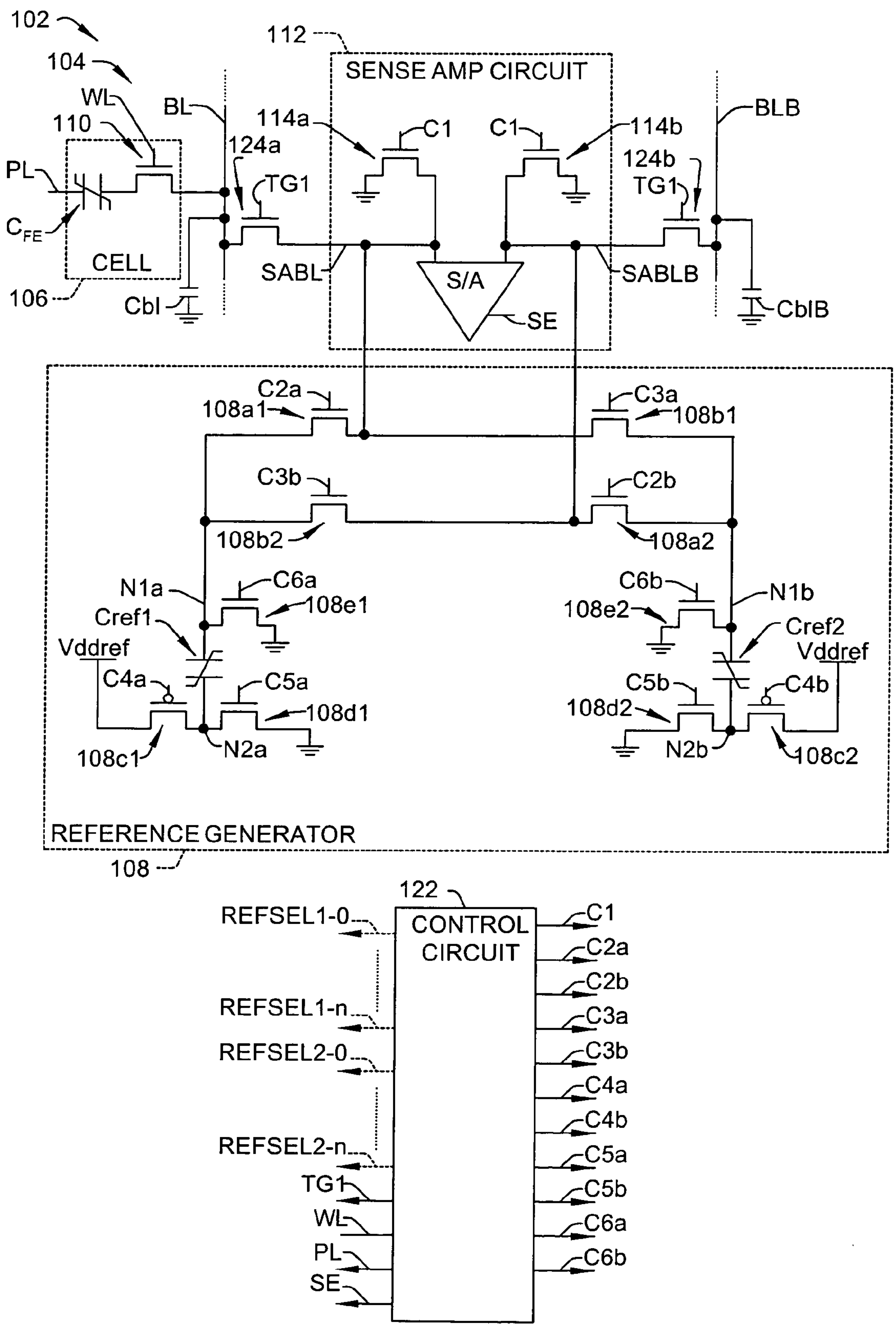
FIG. 4A is a schematic diagram illustrating another exemplary reference generator system in accordance with the invention.
Figure 4B:
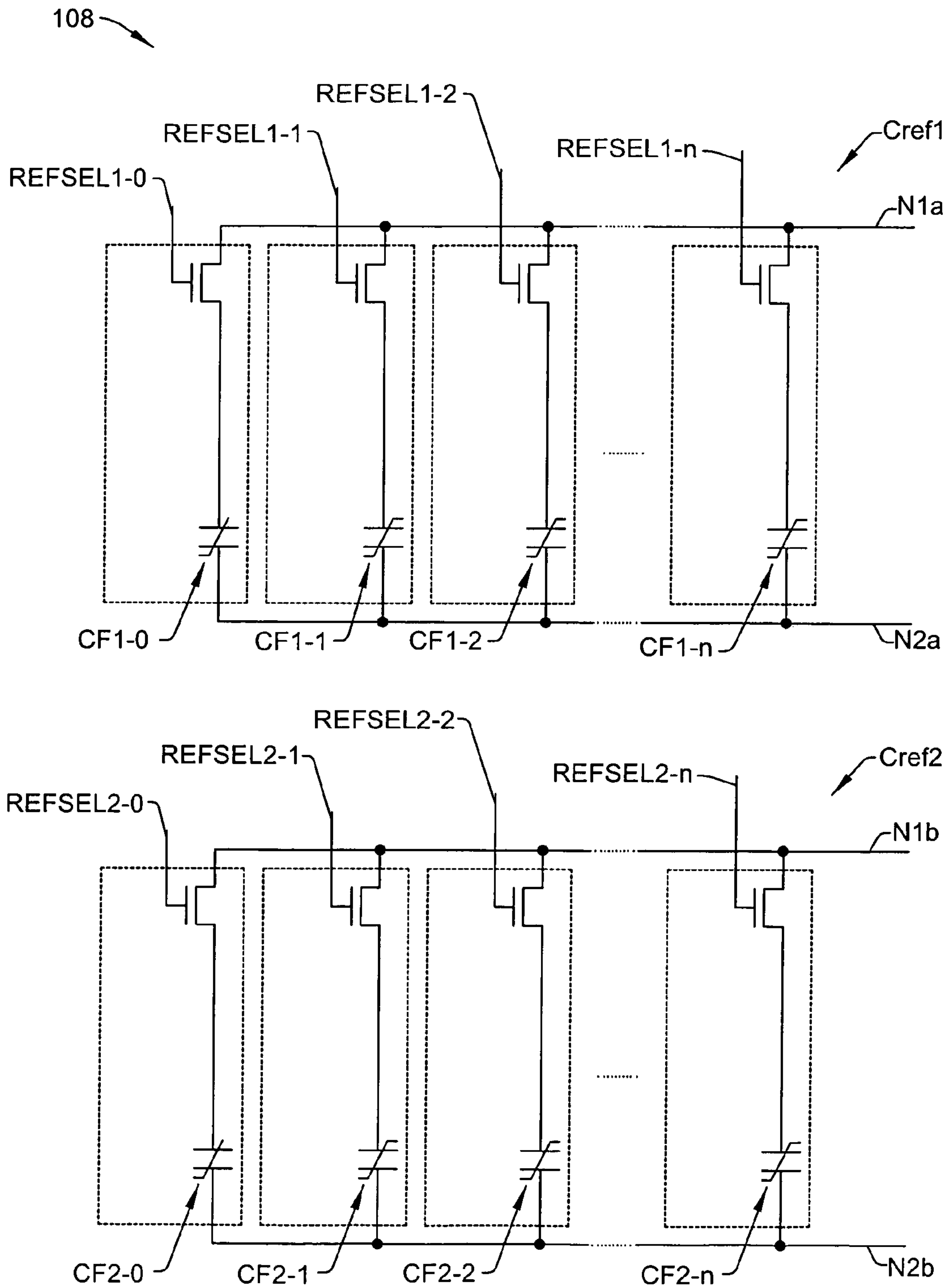
FIG. 4B is a schematic diagram illustrating one implementation of the charge storage device in the system of FIG. 4A, comprising a plurality of selectable ferroelectric capacitors forming first and second variable charge storage devices.
Figure 4C:
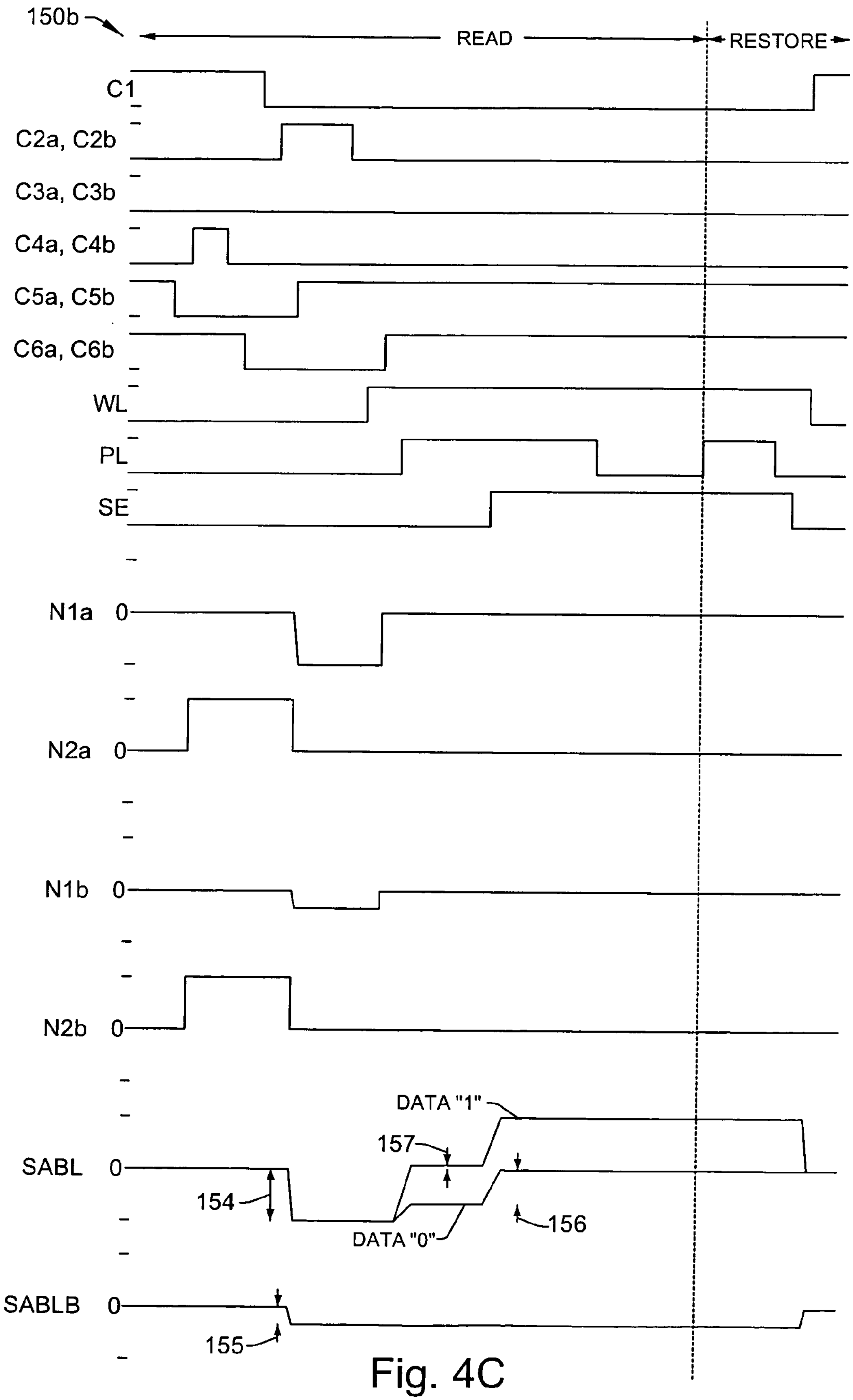
FIG. 4C is a timing diagram illustrating various control and signal waveforms during an exemplary read operation in the device of FIGS. 4A and 4B.

Referring now to FIGS. 4A–4C, in accordance with another aspect of the invention, the reference generator system 108 can also provide a reference voltage to a second sense amp terminal during the memory read operation, which can be positive, negative, or ground, and which can be variable. FIG. 4A illustrates another implementation of a reference generator system 108 in accordance with the invention, comprising a pair of charge storage devices Cref1 and Cref2, as well as a switching system comprising transistors 108_a_1, 108_a_2, 108_b_1, 108_b_2, 108_c_1, 108_c_2, 108_d_1, 108_d_2, 108_e_1, and 108_e_2, to which the control circuit 122 provides control signals C2_a_, C2_b_, C3_a_, C3_b_, C4_a_, C4_b_, C5_a_, C5_b_, C6_a_, and C6_b_.

The system 108 of FIG. 4A essentially provides two similar circuits for providing charge removal/voltage reduction for a sense amp data input SABL or SABLB, and another for providing charge removal/voltage reduction for a sense amp reference input. The first portion of the system 108 (e.g., generally on the left in FIG. 4A) comprises Cref1 with terminal nodes N1_a_ and N2_a_ and transistors 108_a_1, 108_b_2, 108_c_1, 108_d_1, and 108_e_1 for data input charge removal/voltage reduction. The second portion (e.g., generally on the right in FIG. 4A) comprises Cref2 with terminals N2_a_ and N2_b_ and transistors 108_a_2, 108_b_1, 108_c_2, 108_d_2, and 108_e_2 for charge removal/voltage reduction of the sense amp reference input.

The transistors 108_a_1, 108_a_2, 108_b_1, and 108_b_2 are used to selectively connect the individual reference generator portions with individual ones of the sense amp inputs SABL and SABLB, depending upon the selected array row being accessed for a read operation. When accessing a cell 106 along the array bitline BL, control signals C2_a_ and C2_b_ are activated with C3_a_ and C3_b_ being deactivated by the control circuit 122, such that the left portion of the reference generator 108 is coupled to the data input SABL and the right portion is coupled to the reference input SABLB. Conversely, where data is to be read along the complementary array bitline BLB, signals C3_a_ and C3_b_ are activated with C2_a_ and C2_b_ deactivated, such that the left portion of the reference generator 108 is coupled to the data input SABLB and the right portion is coupled to the reference input SABL.

As illustrated in FIG. 4B, moreover, one or both of the charge storage devices Cref1 and Cref2 of FIG. 4A may be variable or programmable in a manner similar to the variable capacitor Cref illustrated and described above in association with FIG. 1B. In this case, the control circuit 122 also provides select signals REFSEL1-0 through REFSEL1-n (e.g., for programming or varying Cref1), as well as REFSEL2-0 through REFSEL2-n for programming Cref2, which may be set through e-fuses or other one-time programmable components, or may be dynamically adjustable after fabrication, for example, according to user-programmable data stored in the ferroelectric memory.

Referring also to the timing diagram 150_b_ of FIG. 4C, each portion of the reference generator system 108 of FIG. 4A is operated so as to initially discharge the associated charge storage device (e.g., transistors 108_d_1, 108_d_2, 108_e_1, and 108_e_2 on), and then to charge up the storage devices (e.g., transistors 108_c_1, 108_c_2, 108_e_1, and 108_e_2 on). The first terminals (N1_a_, N1_b_) of the charged storage devices are then coupled with the appropriate sense amp inputs, and the second terminals (N2_a_, N2_b_) are grounded for sense amp data and reference input charge removal/voltage reduction.

As illustrated in FIG. 4C, this operation causes charge to be extracted from the sense amp inputs SABL and SABLB, which lowers the corresponding voltages, wherein the data input (node N1_a_ and SABL in the illustrated example) is lowered to a relatively large negative voltage 154, and the reference input (e.g., Node N2_a_ and SABLB in this example) is brought to a smaller negative voltage 155. The reference input SABLB essentially remains at the voltage 155 for the remainder of the read operation, but may change slightly according to parasitic influences in the device 102. Once the wordline WL and the plateline pulse PL are applied to the data cell 106, the sense amp data input voltage at SABL begins to rise by an amount dependent on the data stored therein. In the illustrated example, the data input voltage rises to a smaller negative voltage 156 for "0" data and to a higher voltage 157 for "1" data.

The supply voltage Vddref used for precharging the storage devices Cref1 and Cref2 and/or the values of the storage devices Cref1 and Cref2 may be adjusted (e.g., fixed design values and or programmatic adjustment) such that the reference input voltage 155 is approximately midway between the data "0" voltage 156 and the data "1" voltage 157. As with the above implementation of FIGS. 1A–1C, the reference generator system 108 of FIGS. 4A–4C facilitates scaling and reduction in the plateline voltage PL while providing sufficient voltage across the data cell capacitor $C_{FE}$ during read operations, wherein the system 108 of FIGS. 4A–4C further provides a reference voltage for the sense amp reference input, wherein one or both of these features may be variable or programmable. In addition, the reference generator 108 of FIGS. 4A–4C may be operated during read operations using on-pulse sensing (the sense amp is enabled while PL is high as shown in FIG. 4C) or using after-pulse sensing, wherein the sense amp is enabled after the PL goes low.

Referring now to FIGS. 1A and 5, another possible implementation of various aspects of the invention is illustrated in FIG. 5, wherein the circuit of FIG. 1A is operated by the control circuit 122 so as to first provide charge removal/voltage reduction for the sense amp data input, and then to provide charge removal/voltage reduction for the sense amp reference input. In a preferred implementation, the charge storage device Cref is implemented as a programmable bank of ferroelectric capacitors as in FIG. 1B, such that the capacitance may be set to one value for removal/voltage reduction of the sense amp data input, and another value for charge removal/voltage reduction of the sense amp reference input.

FIG. 5 illustrates a timing diagram 150*c* showing the various control signals C1–C6, WL, PL, and SE, as well as the node voltages N1, N2, and the sense amp input voltages SABL and SABLB for an exemplary read operation targeting the cell 106 illustrated in FIG. 1A. Compared with the implementation of FIG. 1C above, the sense amp data input voltage may be reduced further in the approach of FIG. 5, thereby providing more voltage across the cell capacitor $C_{FE}$, since the reference voltage at SABL is now adjustable to a negative value. In addition, the implementation of FIGS. 5 and 1A involves less circuitry than that of FIGS. 4A–4C.

As illustrated in FIG. 5, the signal C1 is initially high to ground the inputs SABL and SABLB, C2 and C3 are low to isolate the inputs SABL and SABLB from the reference generator 108 system, and C5 and C6 are high to discharge the storage device Cref. C5 is then brought low and C4 is brought high while C6 remains high to precharge the storage device Cref. During this process, a first set of selection signals REFSEL0-REFSELn are provided to set the capacitance of the storage device Cref to a first value. C4 and C6 are then brought low and C2 is asserted to couple the device terminal N1 to the sense amp data input SABL. C5 is then asserted to ground the second terminal node N2, causing charge removal/voltage reduction of the input SABL (e.g., and the data bitline BL), wherein the voltage at SABL is reduced to a negative voltage 161. C2 is then brought low to isolate the charge storage device Cref from the sense amp data input SABL.

Thereafter, the charge storage device is changed to a second capacitance value by the control circuit 122 outputting a new set of selection control signals REFSEL0–REFSELn, and the device Cref is then recharged and coupled with the sense amp reference input SABLB. During this process, the wordline signal WL may be brought high to select the target cell 106, and the plateline signal PL is then applied to provide a voltage across the target cell capacitor $C_{FE}$, whereby the voltage on the sense amp input terminal SABL rises by an amount dependent on the data stored in the cell 106. In the example of FIG. 5, the data input voltage SABL rises to a negative voltage 162 for cell data "0" or to a small positive voltage 163 for cell data "1".

With C5 remaining high and C4 remaining low, C6 is again brought high after C2 goes low to again discharge the charge storage device Cref, with a change in the selection signals REFSEL0–REFSELn preferably occurring after C2 goes low and before C6 goes high. With the new (e.g., second capacitance value set for Cref, C5 is brought low and C4 is brought high while C6 remains high to charge the storage device Cref. C4 and C6 are then brought low and C3 is asserted to couple the device terminal N1 to the sense amp reference input SABLB. C5 is then asserted to ground N2, causing charge removal/voltage reduction of the reference input SABLB (e.g., and the reference bitline BLB), thereby reducing the voltage at SABLB to a negative reference value 164, wherein the selection signals REFSEL0–REFSELn and the resulting second capacitance value are such that the reference voltage 164 is approximately midway between the voltages 162 and 163. C3 is then brought low and the sense amp is enabled via the signal SE (e.g., while PL is high for on-pulse sensing as illustrated in FIG. 5, or after PL goes low for after-pulse sensing), wherein the sense amp 112 amplifies and latches the data, after which the read data may be restored to the cell as described above (not shown in FIG. 5).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A ferroelectric memory device, comprising:

an array of ferroelectric memory cells arranged in rows and columns, the cells individually comprising at least one ferroelectric cell capacitor having first and second cell capacitor terminals and at least one cell transistor adapted to selectively couple the first cell capacitor terminal to a data bitline associated with an array column according to an array wordline, wherein rows of the memory cells are coupled with a corresponding wordline;

a sense amp having a first sense amp input coupled with the data bitline during a memory read operation; and a reference generator system coupled with the sense amp, the reference generator system being operable to remove charge from the first sense amp input during the memory read operation prior to application of a plateline signal to the second cell capacitor terminal.

2. The device of claim 1, wherein the reference generator system comprises:

a charge storage device; and a switching system coupled with the charge storage device and with the sense amp, the switching system being operable to selectively couple the charge storage device to the first sense amp input during the memory read operation prior to application of the plateline signal to the second cell capacitor terminal to remove charge from the first sense amp input.

3. The device of claim 2, wherein the charge storage device comprises a variable capacitance operable when coupled with the first sense amp input to remove a variable amount of charge from the first sense amp input.

4. The device of claim 3, wherein the charge storage device comprises:

a plurality of capacitors; and a selection system coupled with the plurality of capacitors and with the switching system, the selection system selectively coupling one or more of the plurality of capacitors with the switching system to provide the variable capacitance.

5. The device of claim 4, wherein the plurality of capacitors are ferroelectric capacitors.

6. The device of claim 2, wherein the charge storage device comprises at least one ferroelectric capacitor.

7. The device of claim 2, wherein the charge storage device comprises first and second terminals, wherein the switching system couples the first terminal to a first voltage and couples the second terminal to a second voltage higher than the first voltage, and wherein the switching system then decouples the second terminal from the second voltage, couples the first terminal to the first sense amp input, and couples the second terminal to the first voltage during the memory read operation prior to application of the plateline signal to the second cell capacitor terminal to remove charge from the first sense amp input.

8. The device of claim 7, wherein the charge storage device comprises a variable capacitance coupled between the first and second terminals, the variable capacitance being operable when coupled with the first sense amp input to remove a variable amount of charge from the first sense amp input.

9. The device of claim 8, wherein the charge storage device comprises:

a plurality of capacitors; and a selection system coupled with the plurality of capacitors and with the switching system, the selection system selectively coupling one or more of the plurality of capacitors between the first and second terminals to provide the variable capacitance.

10. The device of claim 9, wherein the plurality of capacitors are ferroelectric capacitors.

11. The device of claim 7, wherein the charge storage device comprises at least one ferroelectric capacitor.

12. The device of claim 1, wherein the reference generator system provides a negative voltage to the first sense amp input during the memory read operation prior to application of a plateline signal to the second cell capacitor terminal.

13. The device of claim 1, wherein the reference generator system provides a reference voltage to a second sense amp terminal during the memory read operation.

14. The device of claim 13, wherein the reference voltage is variable.

15. The device of claim 13, wherein the reference voltage is negative.

16. The device of claim 1, wherein the array is organized in a folded bitline architecture.

17. The device of claim 1, wherein the array is organized in an open bitline architecture.

18. A ferroelectric memory device, comprising:

an array of ferroelectric memory cells arranged in rows and columns, the cells individually comprising at least one ferroelectric cell capacitor having first and second cell capacitor terminals and at least one cell transistor adapted to selectively couple the first cell capacitor terminal to a data bitline associated with an array column according to an array wordline, wherein rows of the memory cells are coupled with a corresponding wordline;

a sense amp having a first sense amp input coupled with the data bitline during a memory read operation; and a reference generator system coupled with the sense amp, the reference generator system being operable to provide a negative voltage to the first sense amp input during the memory read operation prior to application of a plateline signal to the second cell capacitor terminal.

19. The device of claim 18, wherein the reference generator system comprises:

a charge storage device; and a switching system coupled with the charge storage device and with the sense amp, the switching system being operable to selectively couple the charge storage device to the first sense amp input during the memory read operation prior to application of the plateline signal to the second cell capacitor terminal to provide a negative voltage to the first sense amp input.

20. The device of claim 19, wherein the charge storage device comprises a variable capacitance operable when coupled with the first sense amp input to provide a negative voltage to the first sense amp input.

21. The device of claim 19, wherein the charge storage device comprises first and second terminals, wherein the switching system couples the first terminal to a first voltage and couples the second terminal to a second voltage higher than the first voltage, and wherein the switching system then decouples the second terminal from the second voltage, couples the first terminal to the first sense amp input, and couples the second terminal to the first voltage during the memory read operation prior to application of the plateline signal to the second cell capacitor terminal to provide a negative voltage to the first sense amp input.

22. The device of claim 18, wherein the reference generator system provides a reference voltage to a second sense amp terminal during the memory read operation.

23. The device of claim 22, wherein the reference voltage is variable.

24. The device of claim 22, wherein the reference voltage is negative.

25. The device of claim 18, wherein the array is organized in a folded bitline architecture.

26. The device of claim 18, wherein the array is organized in an open bitline architecture.

27. A reference generator system for a ferroelectric memory device, the reference generator system comprising:

a charge storage device; and a switching system coupled with the charge storage device and with a sense amp in the ferroelectric memory device, the switching system being operable to selectively couple the charge storage device to a first sense amp input during a memory read operation prior to application of a plateline signal to a ferroelectric memory cell being read to reduce a voltage at the first sense amp input.

28. The reference generator system of claim 27, wherein the charge storage device comprises a variable capacitance operable when coupled with the first sense amp input to provide a negative voltage to the first sense amp input.

29. The reference generator system of claim 27, wherein the charge storage device comprises first and second terminals, wherein the switching system couples the first terminal to a first voltage and couples the second terminal to a second voltage higher than the first voltage, and wherein the switching system then decouples the second terminal from the second voltage, couples the first terminal to the first sense amp input, and couples the second terminal to the first voltage during the memory read operation prior to application of the plateline signal to the second cell capacitor terminal to provide a negative voltage to the first sense amp input.

30. A method of reading data from a target ferroelectric memory cell in a ferroelectric memory device, the method comprising:

removing charge from a first sense amp input of a sense amp;

coupling a first terminal of a target ferroelectric memory cell capacitor to the first sense amp input;

providing a plateline signal to a second terminal of the target ferroelectric memory cell capacitor after removing charge from the first sense amp input; and sensing data from the target ferroelectric memory cell capacitor.

31. The method of claim 30, wherein removing charge from the first sense amp input comprises selectively coupling a charge storage device to the first sense amp input prior to providing the plateline signal to the second cell capacitor terminal.

32. The method of claim 30, wherein removing charge from the first sense amp input comprises:

coupling a first terminal of a charge storage device to a first voltage;

coupling a second terminal of the charge storage device to a second voltage higher than the first voltage;

thereafter decoupling the second terminal from the second voltage;

coupling the first terminal to the first sense amp input; and coupling the second terminal to the first voltage prior to providing the plateline signal to the second cell capacitor terminal.

33. A method of reading data from a target ferroelectric memory cell in a ferroelectric memory device, the method comprising:

applying a negative voltage to a first sense amp input of a sense amp;

coupling a first terminal of a target ferroelectric memory cell capacitor to the first sense amp input;

providing a plateline signal to a second terminal of the target ferroelectric memory cell capacitor after applying the negative voltage to the first sense amp input; and sensing data from the target ferroelectric memory cell capacitor.

34. The method of claim 33, wherein applying a negative voltage to the first sense amp input comprises:

coupling a first terminal of a charge storage device to a first voltage;

coupling a second terminal of the charge storage device to a second voltage higher than the first voltage;

thereafter decoupling the second terminal from the second voltage;

coupling the first terminal to the first sense amp input; and coupling the second terminal to the first voltage prior to providing the plateline signal to the second cell capacitor terminal.

* * * * *